United States Patent
Kaneko et al.

(10) Patent No.: US 9,294,072 B2
(45) Date of Patent: Mar. 22, 2016

(54) SEMICONDUCTOR DEVICE AND METHOD FOR ADJUSTING IMPEDANCE OF OUTPUT CIRCUIT

(71) Applicant: Micron Technology, Inc., Boise, ID (US)

(72) Inventors: Yuhei Kaneko, Tokyo (JP); Kohei Nakamura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 14/331,070

(22) Filed: Jul. 14, 2014

(65) Prior Publication Data

US 2015/0022282 A1   Jan. 22, 2015

(30) Foreign Application Priority Data

Jul. 16, 2013 (JP) ................................. 2013-147633

(51) Int. Cl.
    *H03H 7/38* (2006.01)
    *H03H 11/28* (2006.01)
(52) U.S. Cl.
    CPC ..... *H03H 11/28* (2013.01); *H03H 7/38* (2013.01)
(58) Field of Classification Search
    CPC .................................. H03H 7/38; H03H 7/40
    USPC ................................................. 333/32, 17.3
    See application file for complete search history.

(56) References Cited

U.S. PATENT DOCUMENTS

| | | | |
|---|---|---|---|
| 7,495,453 B2 | 2/2009 | Fujisawa | |
| 2008/0164905 A1* | 7/2008 | Hamanaka | G11C 7/1048 326/30 |
| 2009/0146756 A1* | 6/2009 | Fujisawa | G11C 29/02 333/32 |
| 2010/0177588 A1 | 7/2010 | Kaiwa et al. | |

FOREIGN PATENT DOCUMENTS

JP   2000049583   2/2000

* cited by examiner

*Primary Examiner* — Stephen E Jones
(74) *Attorney, Agent, or Firm* — Dorsey & Whitney LLP

(57) ABSTRACT

An impedance adjustment circuit includes a counter circuit outputting a count value thereof as a plurality of first impedance adjustment signals, a mode selection circuit setting a second impedance adjustment signal to be in an active/inactive state irrespective of the count value, and a level fixing circuit fixing a third impedance adjustment signal to be in an active state. A pre-stage circuit generates a plurality of first output control signals, a second output control signal, and a third output control signal in response to the first impedance adjustment signals, the second impedance adjustment signal, and the third impedance adjustment signal, respectively, and a data signal. An output circuit includes a plurality of first transistors, a second transistor, and a third transistor connected in parallel to each other between an output terminal and a first power supply wiring. Control terminals of the first transistors, the second transistor, and the third transistor receive the first output control signals, the second output control signal, and the third output control signal, respectively.

10 Claims, 16 Drawing Sheets

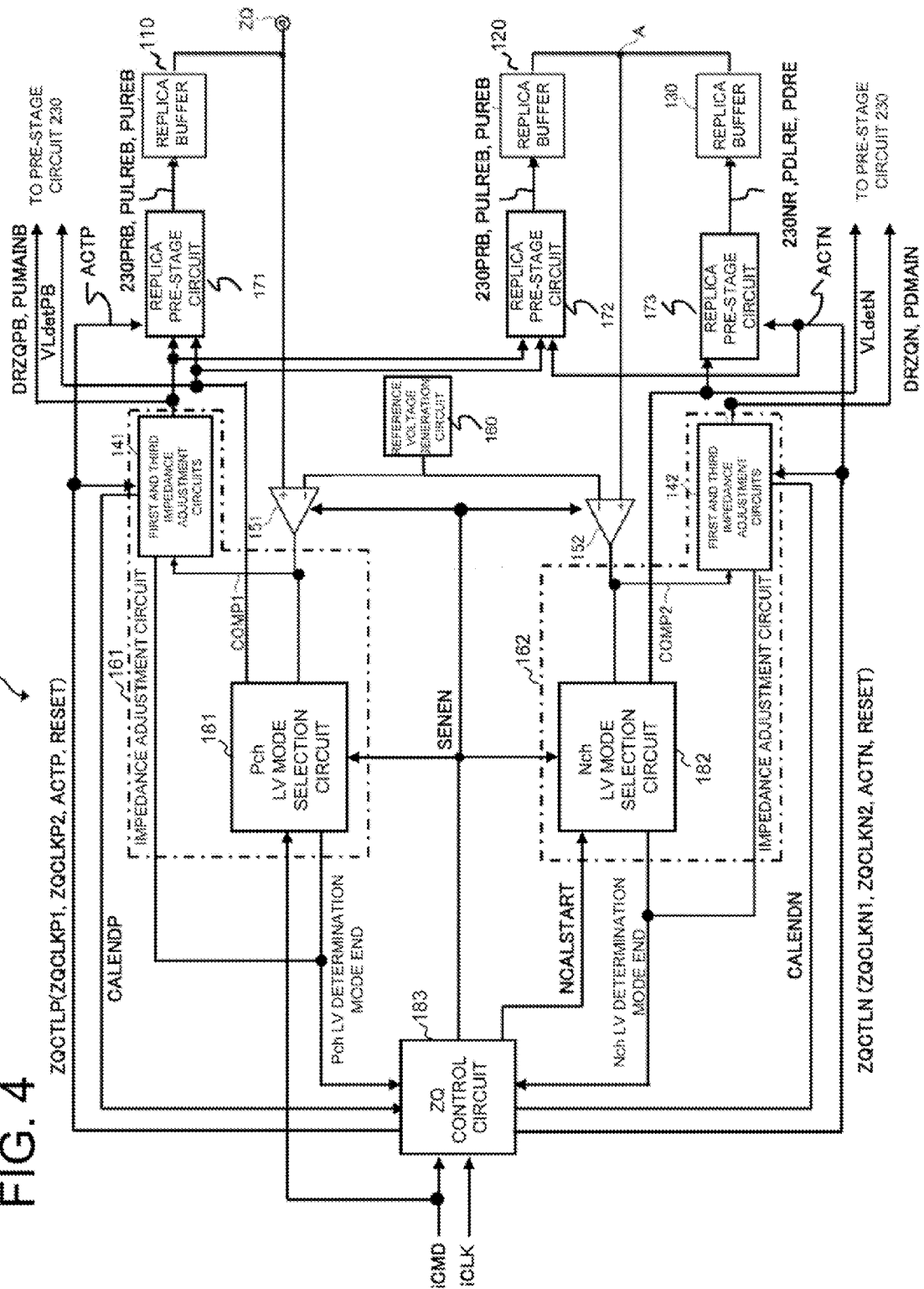

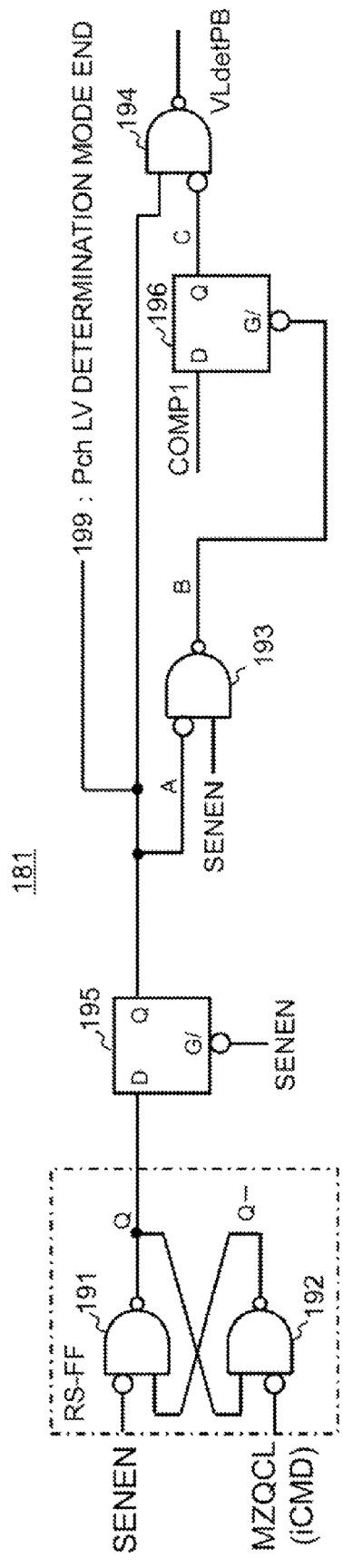
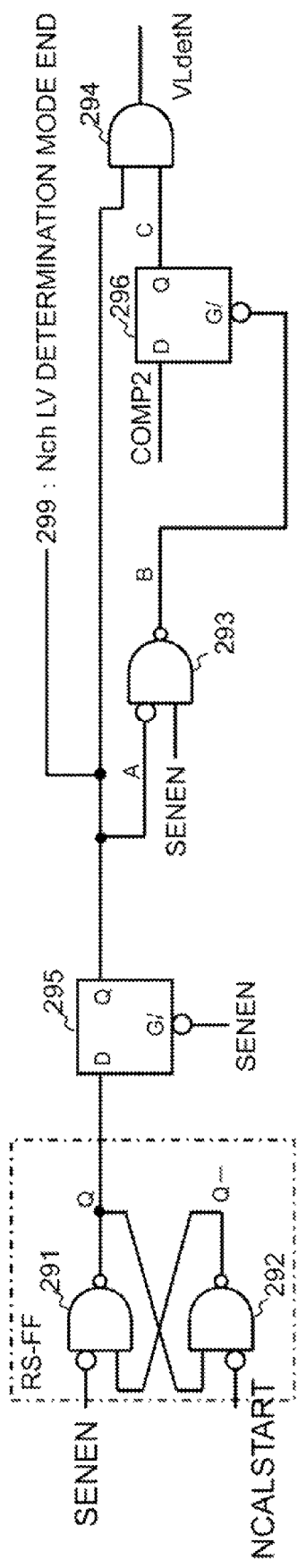
FIG. 5A
FIG. 5B

SEMICONDUCTOR DEVICE AND METHOD FOR ADJUSTING IMPEDANCE OF OUTPUT CIRCUIT

REFERENCE TO RELATED APPLICATION

This application is based upon and claims the benefit of priority of Japanese patent application No. 2013-147633 filed on Jul. 16, 2013, the disclosure of which is incorporated herein in its entirety by reference thereto.

TECHNICAL FIELD

The present invention relates to a semiconductor device. In particular, it relates to a semiconductor device including an output circuit capable of adjusting the impedance thereof.

BACKGROUND

In recent years, with advancement of mobile devices and the like, semiconductor memory devices requiring low power consumption have been demanded. Against such a background, various types of semiconductor memory devices have been developed, a typical example of which is Dynamic Random Access Memories (DRAMs). In addition, these DRAMs are classified into one of the following standards, namely, a normal standard (DDR3) in which the power supply voltage is 1.5 V, a low voltage standard (DDR3L) in which the power supply voltage is 1.35 V, and an ultra-low voltage standard (DDR3U) in which the power supply voltage is 1.25 V. When manufacturing these three types of semiconductor memory devices having different power supply voltages, it is more advantageous in terms of cost to design and manufacture the semiconductor memory devices as a single chip and sort the semiconductor memory devices into the respective standards in a sorting process, rather than to design and manufacture the semiconductor memory devices as different chips. More specifically, it is only necessary to select chips satisfying the low voltage standard and chips satisfying the ultra-low voltage standard from a plurality of chips designed and manufactured as the normal voltage standard products.

In addition, in recent years, a very high data transfer rate has been required for data transfer of semiconductor memory devices (between a CPU and a memory). To realize this, the amplitude of input/output signals has been increasingly reduced. If input/output signals have a smaller amplitude, the accuracy required for the impedance of an output buffer is significantly increased. To address such requirement, normally, an output buffer having an impedance adjustment function is used. Normally, the impedance of an output buffer is adjusted by using a calibration circuit.

Japanese Patent Kokai Publication No. 2000-49583A (Patent Literature 1) discloses an output circuit capable of adjusting the output impedance thereof. The output circuit includes a plurality of transistors connected in parallel to each other, and each transistor is controlled by an impedance adjustment clock signal ZSCK (see FIG. 2 in PTL 1).

Japanese Patent Kokai Publication No. 2010-166299A (Patent Literature 2) discloses an impedance adjustment circuit that performs impedance adjustment by controlling on/off of each of a plurality of transistors that are connected in parallel to each other and that are included in an output buffer. The impedance adjustment circuit uses a replica buffer having substantially the same configuration as that of the output buffer (see FIG. 1 in Patent Literature 2).

Japanese Patent Kokai Publication No. 2006-203405A is listed as Patent Literature 3.

SUMMARY

The following analysis has been given from a viewpoint of the present invention.

The present inventors found that the following problems arise regarding adjustment of the impedance of an output buffer when semiconductor memory devices of a plurality of different power supply voltage standards, such as the above normal standard (DDR3), low voltage standard (DDR3L), and ultra-low voltage standard (DDR3U), are designed and manufactured as a single die.

In the case of the output circuits disclosed in Patent Literatures 1 and 2 that adjust the impedance thereof by switching on/off of the plurality of transistors connected in parallel to each other, when all the plurality of transistors are set to on, the output circuits represent a minimum impedance. If the power supply voltage is decreased, since the drive capability of each transistor included in the output circuit is reduced, the on-resistance of each transistor is increased. Namely, if the power supply voltage is decreased, a value obtained by synthesizing the on-resistances of the plurality of transistors connected in parallel to each other is increased, and a minimum impedance that can be adjusted is increased. Namely, with the output circuits as disclosed in PTLs 1 and 2, if the power supply voltage is decreased, the output impedance range that can be adjusted, more specifically, the lower limit margin, is deteriorated. In addition, if a transistor included in the output circuit has a higher threshold voltage because of production tolerance or the like, the on-resistance of the transistor is also increased. Thus, the above problems are particularly significant when an output circuit including a transistor having a higher threshold voltage because of production tolerance or the like is used at a low voltage.

There are methods as countermeasures against the above problems. In one method, the adjustment range is expanded by increasing the difference among the on-resistances of the plurality of transistors. In another method, the number of transistors connected in parallel to each other is increased. However, in the former case, the accuracy of the impedance adjustment is decreased, counted as a problem. In the latter case, time necessary for the impedance adjustment is significantly increased, counted as a problem.

A semiconductor device according to a first aspect of the present invention comprises an impedance adjustment circuit, a pre-stage circuit, a first power supply wiring, an output terminal, and an output circuit. The impedance adjustment circuit generates a plurality of first impedance adjustment signals, a second impedance adjustment signal, and a third impedance adjustment signal and comprises: a counter circuit outputting a count value thereof as the plurality of first impedance adjustment signals; a mode selection circuit setting the second impedance adjustment signal to be in an active state or in an inactive state irrespective of the count value of the counter circuit; and a level fixing circuit fixing the third impedance adjustment signal to be in an active state. In addition, the pre-stage circuit generates a plurality of first output control signals in response to a data signal and the plurality of first impedance adjustment signals, generates a second output control signal in response to the data signal and the second impedance adjustment signal, and generates a third output control signal in response to the data signal and the third impedance adjustment signal. The output circuit comprises a plurality of first transistors, a second transistor, and a third transistor connected in parallel to each other between the output terminal and the first power supply wiring. The plurality of first transistors are configured to receive the plurality of first output control signals via control terminals of the first transistors, respectively. The second transistor is configured to receive the second output control signal via a control terminal of the second transistor. The third transistor is configured to receive the third output control signal via a control terminal of the third transistor.

An output circuit impedance adjustment method according to a second aspect of the present invention is a method for adjusting the impedance of an output circuit including a plurality of transistors connected in parallel to each other. The output circuit impedance adjustment method comprises the followings. Namely, the method comprises comparing a replica impedance of a replica circuit having a same configuration as that of the plurality of transistors connected in parallel to each other in the output circuit with a desired value while controlling one of the plurality of transistors in the replica circuit to be off as an initial adjustment transistor and transistors other than the initial adjustment transistor to be on in a predetermined determination period. In addition, the method comprises setting, if a result of the comparison indicates that the replica impedance is larger than the desired value, the initial adjustment transistor to on and adjusting the replica impedance by using the transistors other than the initial adjustment transistor after the predetermined determination period. In addition, the method comprises setting, if a result of the comparison indicates that the replica impedance is smaller than the desired value, the initial adjustment transistor to off and adjusting the replica impedance by using the transistors other than the initial adjustment transistor after the predetermined determination period. In addition, the method comprises setting on/off of the plurality of transistors in the output circuit on the basis of a result of the adjustment of the replica impedance.

BRIEF DESCRIPTION OF THE DRAWINGS

FIG. 4 is a block diagram illustrating a configuration of a calibration circuit in FIG. 3.

FIGS. 5A and 5B are circuit diagrams of Pch and Nch LV mode selection circuits in FIG. 4, respectively.

EMBODIMENTS

Figure 1:
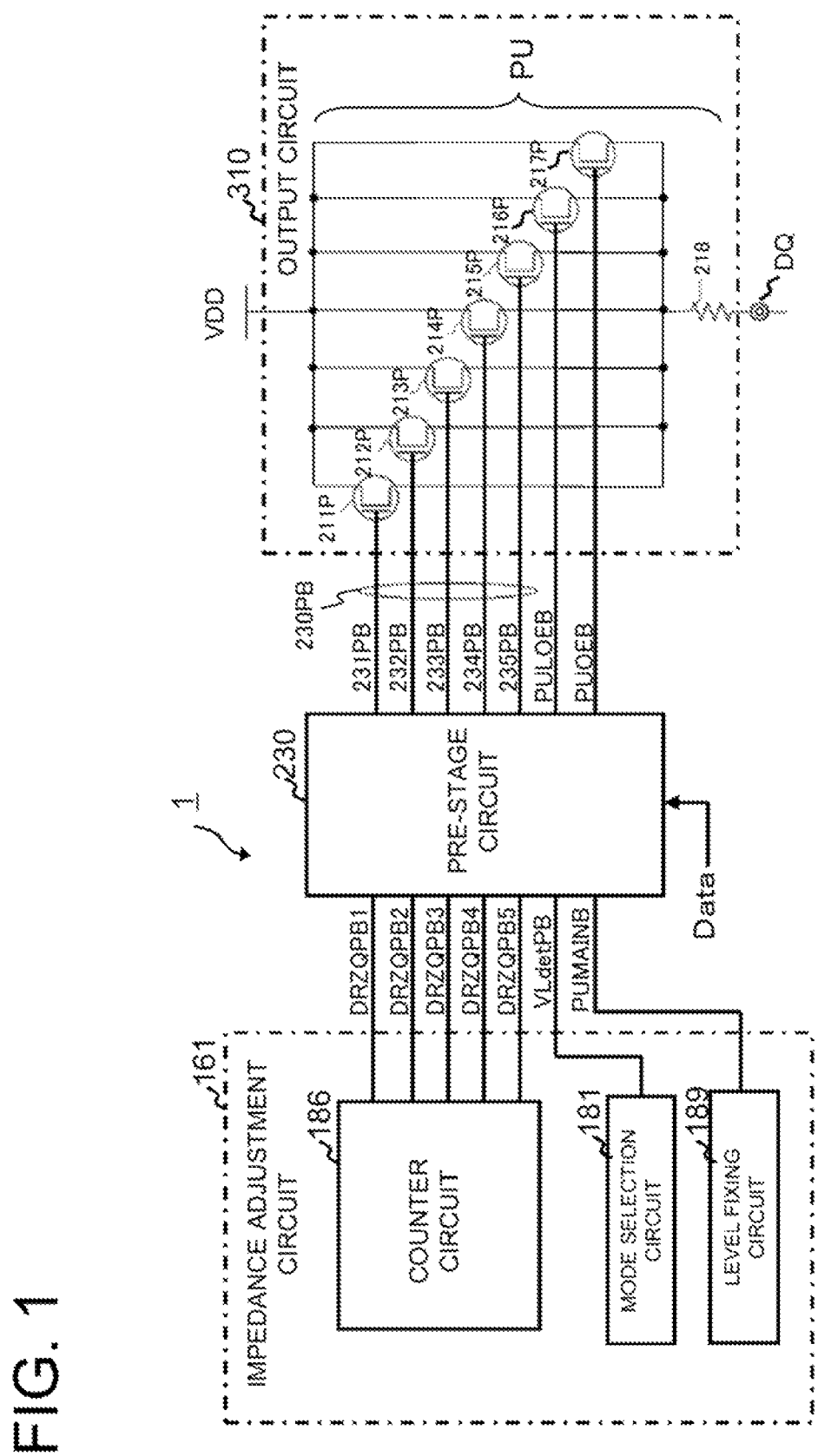
FIG. 1 is a block diagram illustrating a configuration of a semiconductor device according to an exemplary embodiment.

First, an outline of an exemplary embodiment of the present invention will be described. The reference characters used in the following description of the outline of the exemplary embodiment are merely used as examples to facilitate understanding of the present invention, not to limit the present invention to the illustrated modes.

As illustrated in FIG. 1, a semiconductor device 1 according to an exemplary embodiment includes an impedance adjustment circuit 161, a pre-stage circuit 230, a first power supply wiring VDD, an output terminal DQ, and an output circuit 310. The impedance adjustment circuit 161 generates a plurality of first impedance adjustment signals (DRZQPB1 to 5), a second impedance adjustment signal VLdetPB, and a third impedance adjustment signal PUMAINB. The impedance adjustment circuit 161 includes: a counter circuit 186 outputting a count value(s) thereof as the plurality of first impedance adjustment signals (DRZQPB1 to 5); a mode selection circuit 181 setting the second impedance adjustment signal VLdetPB to be in an active state or in an inactive state (for example, the active state corresponds to a Low level and the inactive state corresponds to a High level) irrespective of the count value(s) of the counter circuit 186; and a level fixing circuit 189 fixing the third impedance adjustment signal PUMAINB to be in an active state (for example, a Low level). In addition, the pre-stage circuit 230 generates a plurality of first output control signals (231PB to 235PB) in response to a data signal Data and the plurality of first impedance adjustment signals (DRZQPB1 to 5), generates a second output control signal PULOEB in response to the data signal Data and the second impedance adjustment signal VLdetPB, and generates a third output control signal PUOEB in response to the data signal Data and the third impedance adjustment signal PUMAINB. In addition, the output circuit 310 includes a plurality of first transistors (211P to 215P), a second transistor 216P, and a third transistor 217P connected in parallel to each other between the output terminal DQ and the first power supply wiring VDD. The plurality of first transistors (211P to 215P) are configured to receive the plurality of first output control signals (231PB to 235PB) via control terminals of the first transistors (211P to 215P), respectively. The second transistor 216P is configured to receive the second output control signal PULOEB via a control terminal of the second transistor 216P. The third transistor 217P is configured to receive the third output control signal PUOEB via a control terminal of the third transistor 217P.

Figure 12:
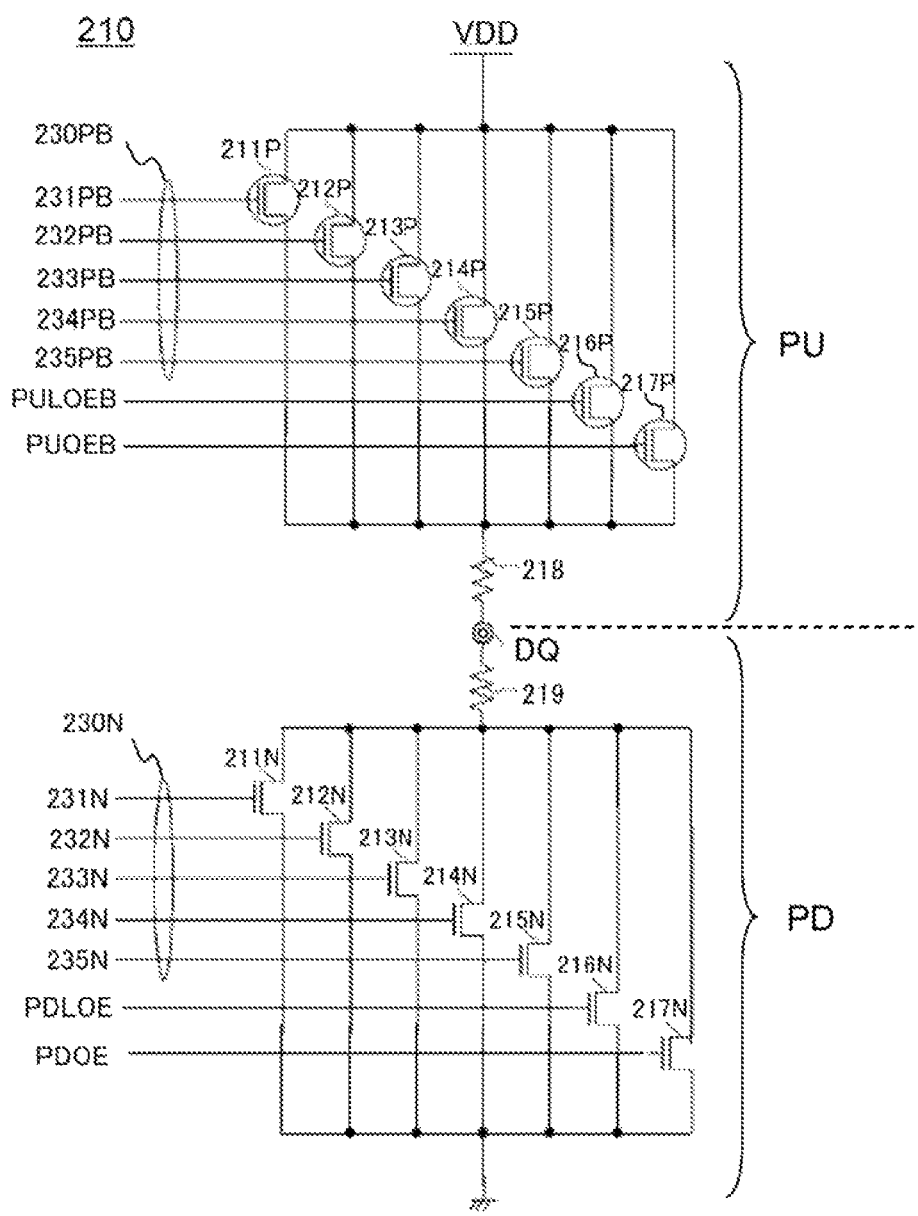
FIG. 12 is a circuit diagram of an output buffer in FIG. 3.

In addition, in the semiconductor device, the above first power supply wiring may be VSS (an earth wiring) and the above output circuit may have a configuration of a pull-down (PD) unit illustrated in FIG. 12. Namely, the output circuit may include a plurality of first transistors (211N to 215N in FIG. 12), a second transistor (216N in FIG. 12), and a third transistor (217N in FIG. 12) connected in parallel to each other between the output terminal DQ and the first power supply wiring VSS. The plurality of first transistors (211N to 215N in FIG. 12) are configured to receive the plurality of first output control signals (231N to 235N in FIG. 12) via control terminals of the first transistors, respectively. The second transistor (216N in FIG. 12) is configured to receive the second output control signal (PDLOE in FIG. 12) via a control terminal of the second transistor (216N in FIG. 12). The third transistor (217N in FIG. 12) is configured to receive the third output control signal (PDOE in FIG. 12) via a control terminal of the third transistor (217N in FIG. 12).

According the configuration of the above semiconductor device, a second transistor (216P, 216N) is newly added to the plurality of first transistors connected in parallel to each other, to avoid deterioration of the lower limit margin without decreasing the accuracy of the impedance adjustment when the semiconductor device is used at a low power supply voltage. In addition, the second transistor (216P, 216N) is configured to receive the second output control signal (PULOEB, PDLOE) via the control terminal of the second transistor (216P, 216N). In this way, since on/off control of the second transistor (216P, 216N) can be performed on the basis of the second output control signal (PULOEB, PDLOE), the addition of the second transistor does not significantly increase the adjustment period of the impedance adjustment. Namely, the semiconductor device can contribute to prevention of deterioration of the lower limit margin in impedance adjustment without decreasing the accuracy of the impedance adjustment and without significantly increasing the adjustment period when the semiconductor device is used at a low power supply voltage.

As illustrated in FIG. 10, it is preferable that the semiconductor device further include a replica circuit 110 including a plurality of fourth transistors (111 to 115), a fifth transistor 116, and a sixth transistor 117 that correspond to the plurality of first transistors (211P to 215P in FIG. 1), the second transistor (216P in FIG. 1), and the third transistor (217P in FIG. 1) in the output circuit, respectively, and that are connected in parallel to each other. In addition, it is preferable that the counter circuit (186 in FIG. 1), the mode selection circuit (181 in FIG. 1), and the level fixing circuit (189 in FIG. 1) control the plurality of fourth transistors (111 to 115), the fifth transistor 116, and the sixth transistor 117 on the basis of the plurality of first impedance adjustment signals (DRZQPB1 to 5 in FIG. 1), the second impedance adjustment signal (VLdetPB in FIG. 1), and the third impedance adjustment signal (PUMAINB in FIG. 1), respectively, to adjust a replica impedance of the replica circuit 110.

Figure 10A:
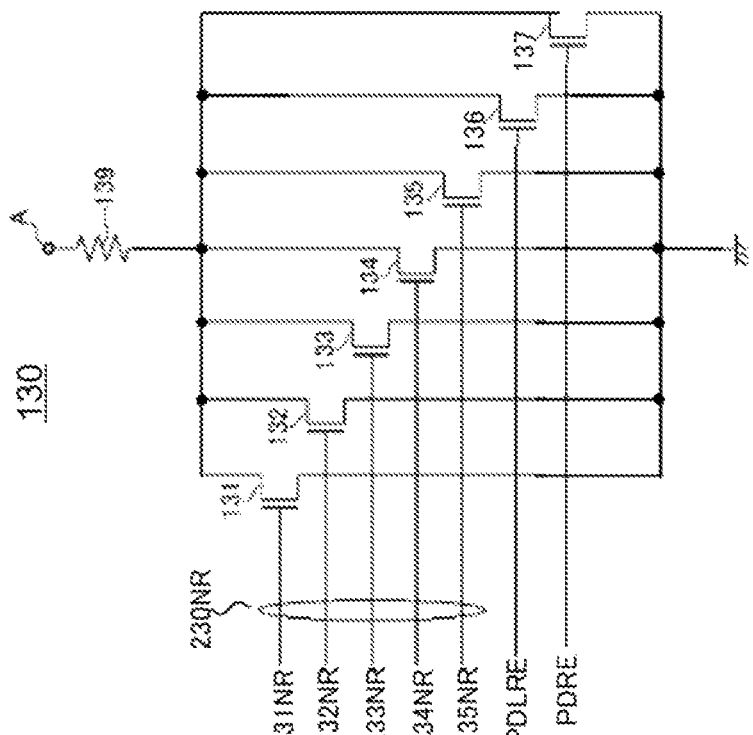
FIGS. 10A and 10B are circuit diagrams of replica buffers in FIG. 4.
Figure 10B:
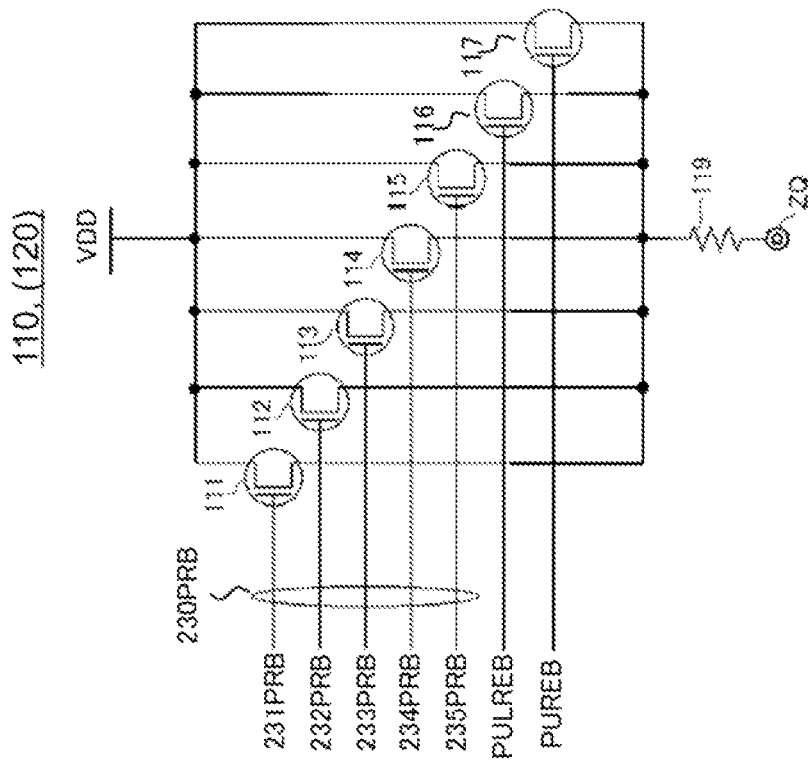

It is preferable that the PD unit (FIG. 12) of the above output circuit further include a replica circuit (130) including a plurality of fourth transistors (131 to 135), a fifth transistor (136), and a sixth transistor (137) illustrated in FIG. 10B that correspond to the plurality of first transistors (211N to 215N in FIG. 12), the second transistor (216N in FIG. 12), and the third transistor (217N in FIG. 12) in the output circuit, respectively, and that are connected in parallel to each other. In addition, it is preferable that a counter circuit (286 in FIG. 8), a mode selection circuit (182 in FIG. 4), and a level fixing circuit (289 in FIG. 8) control the plurality of fourth transistors (131 to 135), the fifth transistor 136, and the sixth transistor 137 on the basis of a plurality of first impedance adjustment signals (DRZQN in FIG. 4), a second impedance adjustment signal (VLdetN in FIG. 4), and a third impedance adjustment signal (PDMAIN in FIG. 4), respectively, to adjust replica impedance of the replica circuit 130.

In the semiconductor device, it is preferable that, in a predetermined determination period (an LV determination period in FIG. 6), the impedance adjustment circuit (161 in FIG. 1) compare the replica impedance with a desired value (for example, external resistor R in FIG. 3) while controlling the plurality of first impedance adjustment signals (DRZQPB1 to 5 in FIG. 1) and the third impedance adjustment signal (PUMAINB in FIG. 1) to be in an active state and the second impedance adjustment signal (VLdetPB in FIG. 1) to be in an inactive state. In addition, it is preferable that, after the predetermined determination period (an LV determination period in FIG. 6), the mode selection circuit (181 in FIG. 1) in the impedance adjustment circuit set the second impedance adjustment signal (VLdetPB in FIG. 1) on the basis of a result of the comparison.

Figure 6:
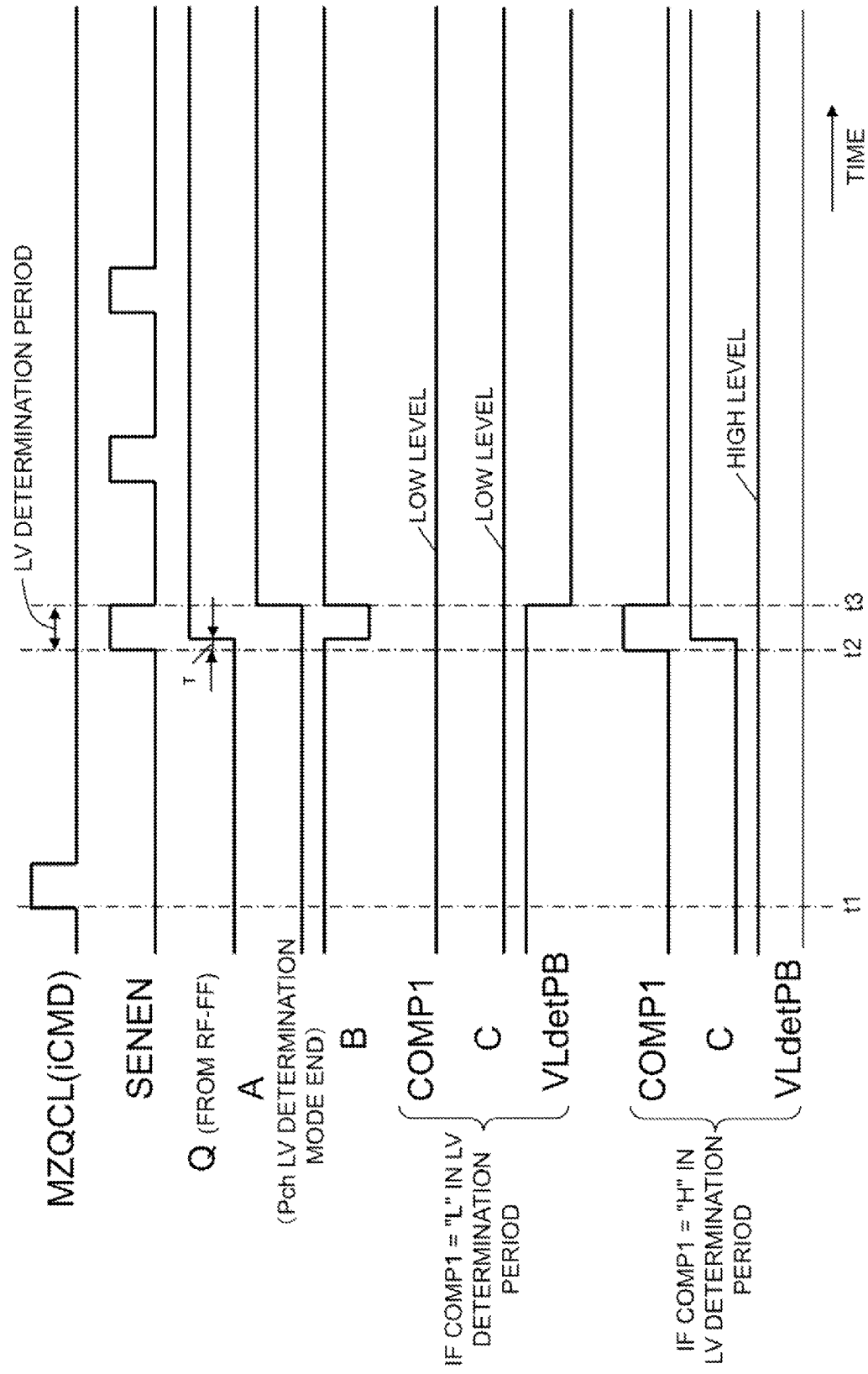
FIG. 6 is a waveform diagram illustrating an operation of the Pch LV mode selection circuit in FIG. 5.

In the semiconductor device, it is preferable that, if the result of the comparison indicates that the replica impedance is larger than the desired value (for example, external resistor R in FIG. 3), the mode selection circuit (181 in FIG. 1) in the impedance adjustment circuit set the second impedance adjustment signal (VLdetPB in FIG. 1) to be in an active state after the predetermined determination period (an LV determination period in FIG. 6) and if the result of the comparison indicates that the replica impedance is smaller than the desired value (for example, external resistor R in FIG. 3), the mode selection circuit (181 in FIG. 1) in the impedance adjustment circuit set the second impedance adjustment signal (VLdetPB in FIG. 1) to be in an inactive state after the predetermined determination period (an LV determination period in FIG. 6).

In the semiconductor device, the mode selection circuit (181 in FIG. 1) may generate a determination mode end signal (199 in FIG. 5) indicating that the predetermined determination period (an LV determination period in FIG. 6) is ended. In addition, the impedance adjustment circuit (161 in FIG. 1) may start adjustment of the replica impedance by using the first impedance adjustment signals (DRZQPB1 to 5 in FIG. 1) outputted by the counter circuit (186 in FIG. 1) in response to the determination mode end signal (199 in FIG. 5).

It is preferable that the semiconductor device include: an external resistor (external resistor R in FIG. 3) having an impedance corresponding to the above desired value; a first terminal (ZQ in FIG. 4) connected to one end of the replica circuit (110 in FIG. 4) and one end of the external resistor; and a comparison circuit (151 in FIG. 4) including two input nodes, one (non-inverting input terminal of 151 in FIG. 4) of which is connected to the first terminal (ZQ in FIG. 4) and the other (inverting input terminal of 151 in FIG. 4) of which is supplied with a reference voltage. In addition, it is preferable that the comparison circuit (151 in FIG. 4) output the result of the comparison.

The semiconductor device may include: a second replica circuit (120 in FIG. 4) having an impedance adjusted to correspond to the desired value; a first node (A in FIG. 4) connected to one end of the replica circuit (130 in FIG. 4) and one end of the second replica circuit (120 in FIG. 4); and a comparison circuit (152 in FIG. 4) including two input nodes, one (non-inverting input terminal of 152 in FIG. 4) of which is connected to the first node (A in FIG. 4) and the other (inverting input terminal of 152 in FIG. 4) of which is supplied with a reference voltage. In addition, the comparison circuit (152 in FIG. 4) may output the result of the comparison.

In the semiconductor device, it is preferable that on-resistance of the second transistor (216P in FIG. 1) be smaller than on-resistances of the first transistors (211P to 215P in FIG. 1).

In the semiconductor device, it is preferable that on-resistance of the fifth transistor (116 in FIG. 10A) be smaller than on-resistances of the fourth transistors (111 to 115 in FIG. 10A).

Figure 14:
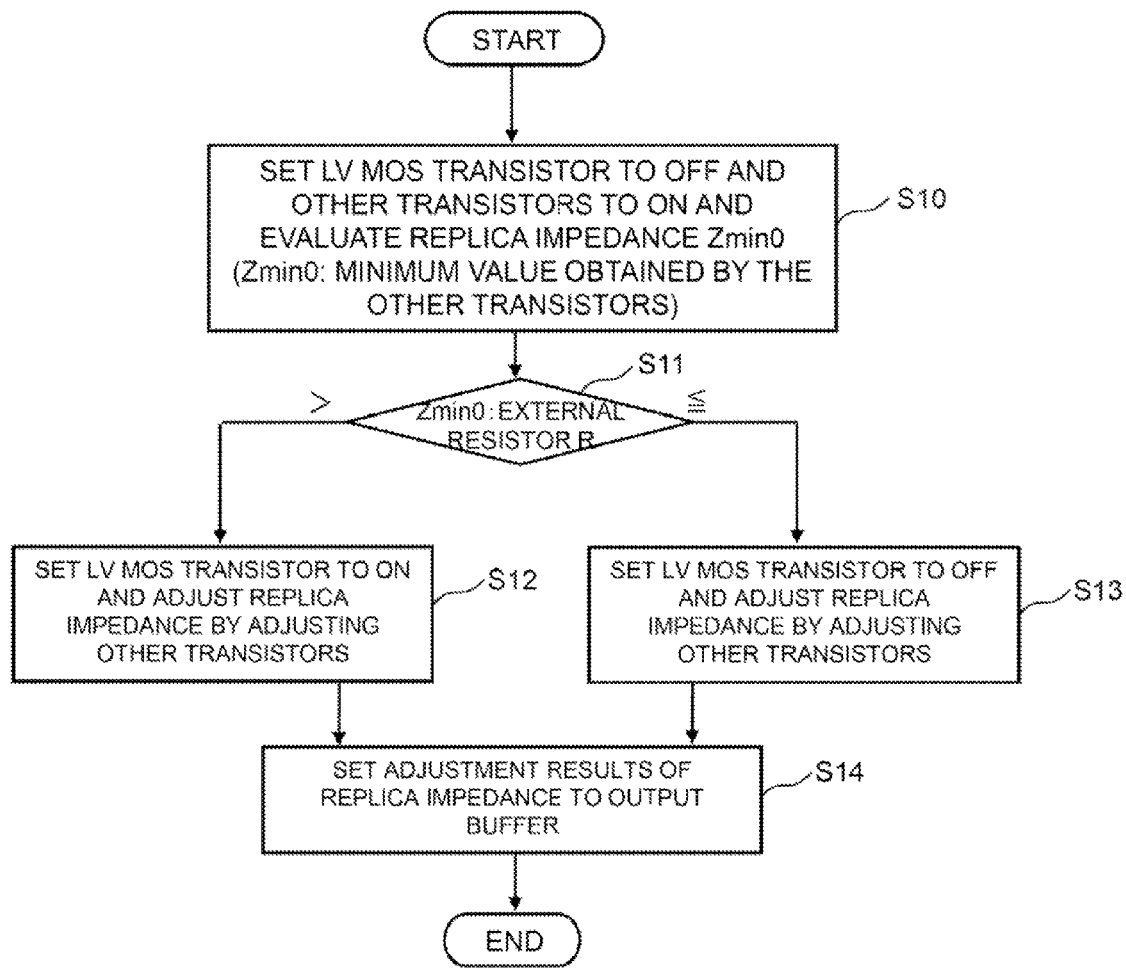
FIG. 14 is a flow chart illustrating a principle of a method for adjusting the impedance of an output circuit according to the first exemplary embodiment.

As illustrated in FIG. 14, an output circuit impedance adjustment method according to an exemplary embodiment is a method for adjusting an impedance of an output circuit (310 in FIG. 1) including a plurality of transistors (for example, 211P to 217P in FIG. 1) connected in parallel to each other. The output circuit impedance adjustment method includes the following steps. Namely, the output circuit impedance adjustment method includes a step (S10) of comparing a replica impedance of a replica circuit (for example, 110 in FIG. 10A) having a same configuration as that of the plurality of transistors (for example, 211P to 217P in FIG. 1) connected in parallel to each other in the output circuit with a desired value (external resistor R in FIG. 3) while controlling one (for example, 116 in FIG. 10A) of the plurality of transistors in the replica circuit to be off as an initial adjustment transistor and transistors (for example, 111 to 115 and 117 in FIG. 10A) other than the initial adjustment transistor to be on in a predetermined determination period. In addition, the output circuit impedance adjustment method includes a step (S12) of setting, if a result of the comparison indicates that the replica impedance is larger than the desired value (external resistor R in FIG. 3), the initial adjustment transistor (for example, 116 in FIG. 10A) to on and adjusting the replica impedance by using the transistors (11 to 115 in FIG. 10A) other than the initial adjustment transistor after the predetermined determination period. In addition, the output circuit impedance adjustment method includes a step (S13) of setting, if a result of the comparison indicates that the replica impedance is smaller than the desired value (external resistor R in FIG. 3), the initial adjustment transistor (for example, 116 in FIG. 10A) to off and adjusting the replica impedance by using the transistors (111 to 115 in FIG. 10A) other than the initial adjustment transistor after the predetermined determination period. In addition, the output circuit impedance adjustment method includes a step (S14) of setting on/off of the plurality of transistors (for example, 211P to 217P in FIG. 1) in the output circuit on the basis of a result of the adjustment of the replica impedance. The above initial adjustment transistor corresponds to a fourth transistor described above.

Next, exemplary embodiments of the present invention will be described in detail with reference to the drawings.

First Exemplary Embodiment

Description of Principle

First, a principle of a first exemplary embodiment will be described with reference to FIG. 1, FIG. 10A, FIG. 14, and FIG. 15. In practice, an output buffer 210 according to the first exemplary embodiment includes a pull-up (PU) unit and a pull-down (PD) unit as illustrated in FIG. 12 which will be described below, and ZQ calibration is performed with an aim to match the impedance of each of the PU unit and the PU unit to a desired value (an external resistor R in FIG. 3). However, in this description of the principle, for ease of description, ZQ calibration performed on an output buffer 310 in FIG. 1 including only the PU unit will be described. In addition, in the ZQ calibration, first, the impedance adjustment is performed by using a replica circuit 110, which is a replica of the output buffer 310, and next, the adjustment results obtained by the replica buffer 110 are set to the output buffer 310. Thus, the following description of the principle will mainly be made with a focus on an operation of the replica circuit 110 in FIG. 10A.

FIG. 10A illustrates transistors connected in parallel to each other. The transistors are five PMOS transistors (111 to 115), each of which can be switched on/off, an LV MOS transistor 116 arranged for a low power supply voltage (LV), and a main transistor 117 set to be in an on-state when the PU unit is in an active state. The replica impedance of the replica circuit 110 is represented by formulas (1) and (2).

$$\text{Replica Impedance} = R_{119} + 1(1/R_{main} + 1/r) \quad \text{Formula (1)}$$

$$r = 1/(1/R_{111} + 1/R_{112} + 1/R_{113} + 1/R_{114} + 1/R_{115} 1/R_{116}) \quad \text{Formula (2)}$$

$R_{119}$ represents the resistance value of a resistor 119 and $R_{main}$ represents the on-resistance of the main transistor 117. In addition, $R_{111}$ to $R_{116}$ represent the resistance values of the respective PMOS transistors 111 to 116. When set to off, these PMOS transistors 111 to 116 are in a non-conductive state. When set to on, these PMOS transistors 111 to 116 have on-resistances.

The replica impedance represents a maximum value Zmax when all the PMOS transistors 111 to 116 are off and represents a minimum value Zmin when all the PMOS transistors 111 to 116 are on. To match the replica impedance to the external resistor R (hereinafter, the resistance value of the external resistor R will simply be referred to as "an external resistor R"), the following formula (3) needs to be satisfied.

$$\text{Zmin} \le \text{External Resistor } R \le \text{Zmax} \quad \text{Formula (3)}$$

To expand the impedance adjustment range in the direction of the lower impedance limit, the replica circuit 110 includes the LV MOS transistor 116. However, if the replica circuit 110 does not include such LV MOS transistor, formula (2) is changed to the following formula (4).

$$r0 = 1/(1/R_{111} + 1/R_{112} + 1/R_{113} + 1/R_{114} + 1/R_{115}) \quad \text{Formula (4)}$$

Assuming that Zmin0 represents the replica impedance obtained when all the PMOS transistors 111 to 115 are on, the following relationship expressed by formula (5) is established. Namely, if the replica circuit 110 includes the LV MOS transistor 116, the lower limit of the replica impedance is wider by |Zmin−Zmin0|, than otherwise.

$$\text{Zmin} < \text{Zmin0} \quad \text{Formula (5)}$$

In addition, if the replica circuit 110 does not include the LV MOS transistor 116, formula (6) needs to be satisfied to match the replica impedance to the external resistor R.

$$\text{Zmin0} \le \text{External Resistor } R \le \text{Zmax} \quad \text{Formula (6)}$$

In the first exemplary embodiment, since the LV MOS transistor 116 is newly arranged, the number of PMOS transistors adjusted to be on/off is increased from five to six. If the number of transistors is increased by one in this way, the maximum number of comparisons between the replica impedance and the external resistor R is increased twice. Namely, the ZQ calibration may not finish within a required period, counted as a problem. As a possible method for solving this problem, ZQ codes (codes representing on/off of each transistor; corresponding to DRZQPB) could be calibrated in a binary search manner. However, if an erroneous determination attributable to a capability limit of a comparator is caused, values may not converge. In addition, in another possible method, an on-resistance value is selected so that the width of one step of the ZQ codes is expanded with the same number of PMOS transistors. However, in such case, while the impedance adjustment range can be expanded, the accuracy of the ZQ calibration is deteriorated.

Thus, in the ZQ calibration according to the first exemplary embodiment, a method illustrated in a flow chart in FIG. 14 is used to solve the above problem. In FIG. 14, first, the LV MOS 116 is set to off, the other transistors (111 to 115 and 117) are set to on, and the replica impedance Zmin0 is evaluated (S10). As described above, Zmin0 is a minimum value obtained when the LV MOS transistor 116 is set to off (namely, when the LV MOS transistor 116 is not arranged).

Next, Zmin0 and the resistance value of the external resistor R are compared with each other (S11). In step S11, if Zmin0>external resistor R, the condition expressed by formula (6) is not satisfied. Thus, in such case, the LV MOS transistor 116 needs to be set to on. Accordingly, the replica impedance is adjusted by adjusting on/off of the PMOS transistors 111 to 115 while the LV MOS transistor 116 is maintained on (S12).

In contrast, if Zmin0≤external resistor R in step S11, the condition expressed by formula (6) is satisfied. Thus, in such case, the replica impedance is adjusted by adjusting on/off of the PMOS transistors 111 to 115 while the LV MOS transistor 116 is maintained off (S13).

Next, the adjustment results of the replica impedance (on/off of the PMOS transistors 111 to 115 and the LV MOS transistor 116) are set to the respective transistors in the output buffer 310.

Figure 15:
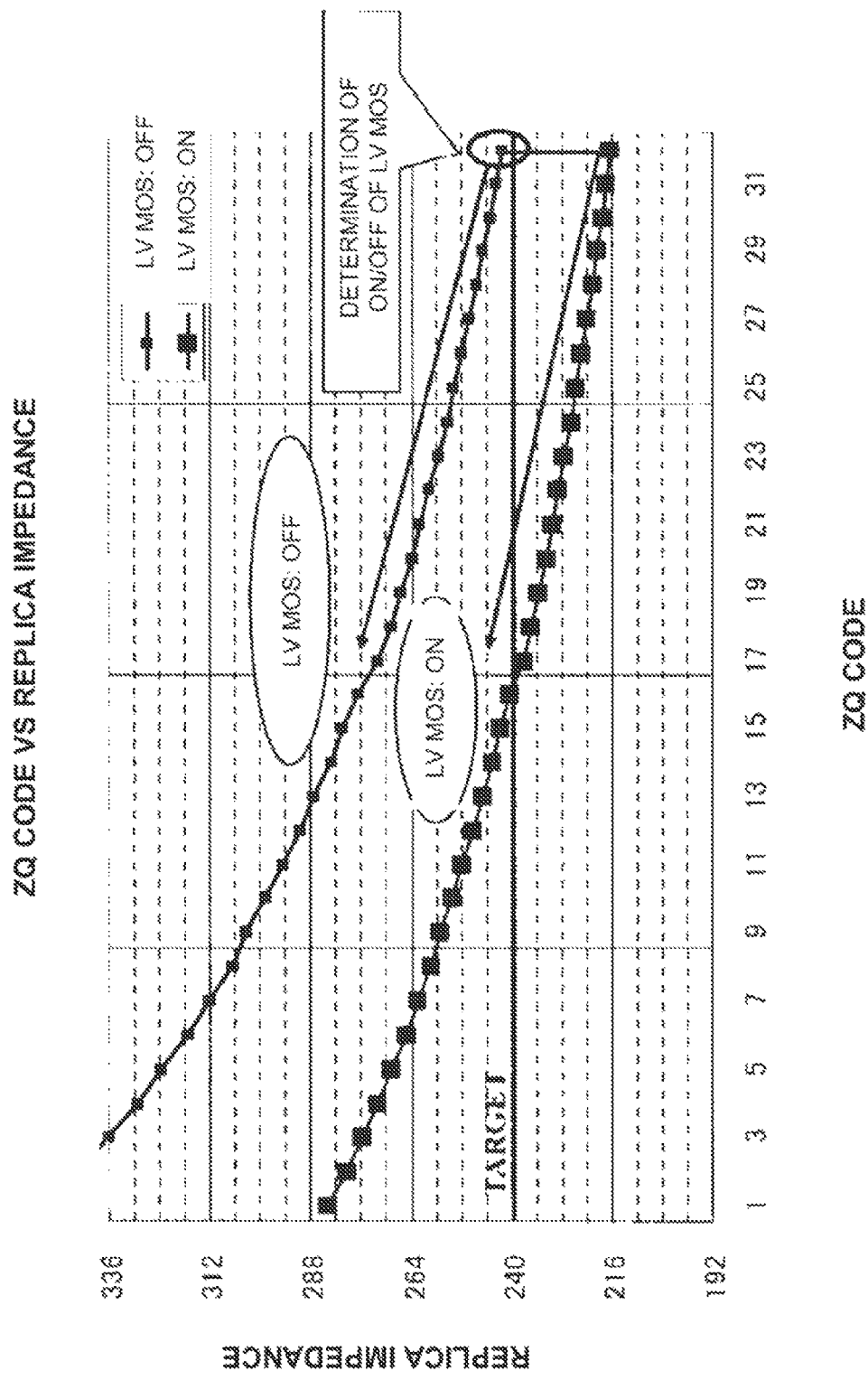
FIG. 15 is a diagram illustrating the principle of the method for adjusting the impedance of the output circuit according to the first exemplary embodiment.

FIG. 15 illustrates ZQ calibration performed on the basis of the flow chart in FIG. 14. The external resistor R, which is the desired value (TARGET) of the impedance adjustment, is 240Ω. Since the impedance Zmin0 obtained in step S10 in FIG. 14 is lower than 240 (portion indicating "LV MOS ON/OFF determination" in FIG. 15), the operation proceeds to step S12. In step S12, the impedance is adjusted by setting the LV MOS transistor 116 to be in an on-state and changing on/off of the PMOS 111 to 115 on the basis of ZQ codes (see a curve indicated by "LV MOS: ON" in FIG. 15). As a result, when the ZQ code is 16, the condition closest to the desired value 240Ω is obtained.

As described above, according to the method illustrated in FIG. 14, the increase of the number of comparisons by the addition of the LV MOS transistor 116 can be minimized to one (step S11). In this way, even when the LV MOS transistor is arranged and the lower limit margin of the impedance of the output buffer and of the replica impedance of the replica buffer are expanded, the accuracy of the impedance adjustment is not deteriorated and the adjustment period is not significantly increased.

Since on/off of the LV MOS transistor 116 is for roughly determining the impedance adjustment range, it is desirable that the on-resistance of the LV MOS transistor 116 be set to a value smaller than those of the PMOS transistors 111 to 115. In addition, likewise, it is desirable that the on-resistance of the LV MOS transistor 216P in the output buffer 310 be set to a value smaller than those of the PMOS transistors 211P to 215P.

(Configuration of the First Exemplary Embodiment)

Next, a configuration of a semiconductor device 10 according to the first exemplary embodiment will be described. The semiconductor device 10 includes the output buffer (210 in FIG. 3) and a calibration circuit (100 in FIG. 3) performing ZQ calibration on the basis of the above description of the principle.

Figure 2:
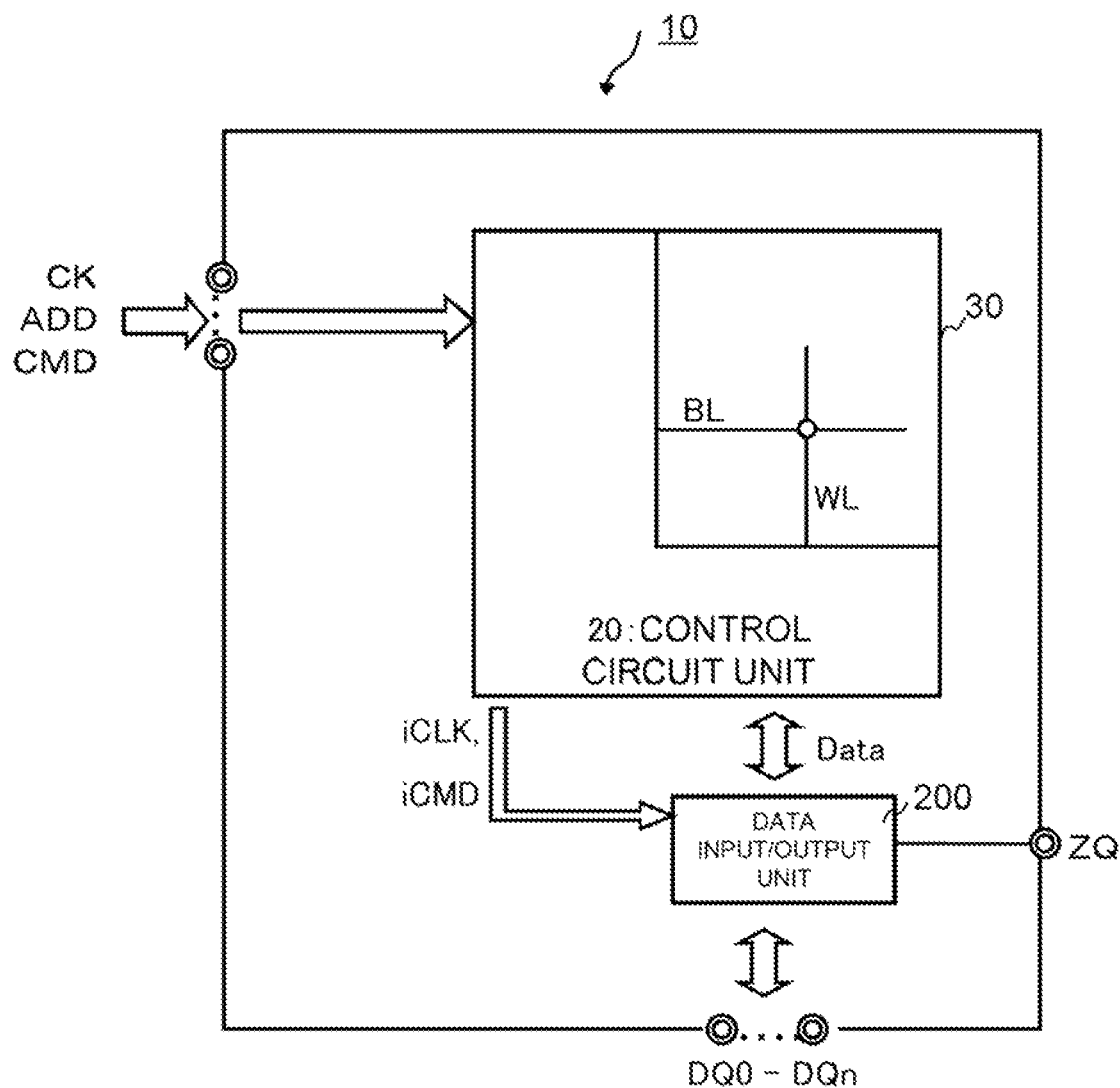
FIG. 2 is a block diagram illustrating a configuration of a semiconductor device according to a first exemplary embodiment.

FIG. 2 is a block diagram illustrating a configuration of the semiconductor device 10. In FIG. 2, for example, the semiconductor device 10 is a DRAM including a control circuit unit 20, a memory cell array 30, a data input/output unit 200, various input terminals CK, ADD, and CMD for external clocks, address signals, and commands, data input/output terminals DQ0 to n, and a calibration terminal ZQ.

The control circuit unit 20 activates a word line WL and a bit line BL on the basis of signals such as an external clock, an address signal, and a command inputted from various input terminals CK, ADD, and CMD. The control circuit unit 20 accesses a memory cell in the memory cell array 30, the memory cell corresponding to the intersection of the activated word line and bit line. If the inputted command relates to reading, the accessed memory cell data is outputted to the data input/output terminals DQ0 to n via the data input/output unit 200. If the inputted command relates to writing, the data inputted from the data input/output terminals DQ0 to n is captured by the control circuit unit 20 via the data input/output unit 200 and written in the accessed memory cell.

The input/output operation of the data input/output unit 200 is set by an internal clock iCLK and internal commands iCMD from the control circuit unit 20. In addition, the data input/output unit 200 has a function of adjusting the output impedance of the output buffer (210 in FIG. 3) on the basis of the external impedance of the calibration terminal ZQ.

Figure 3:
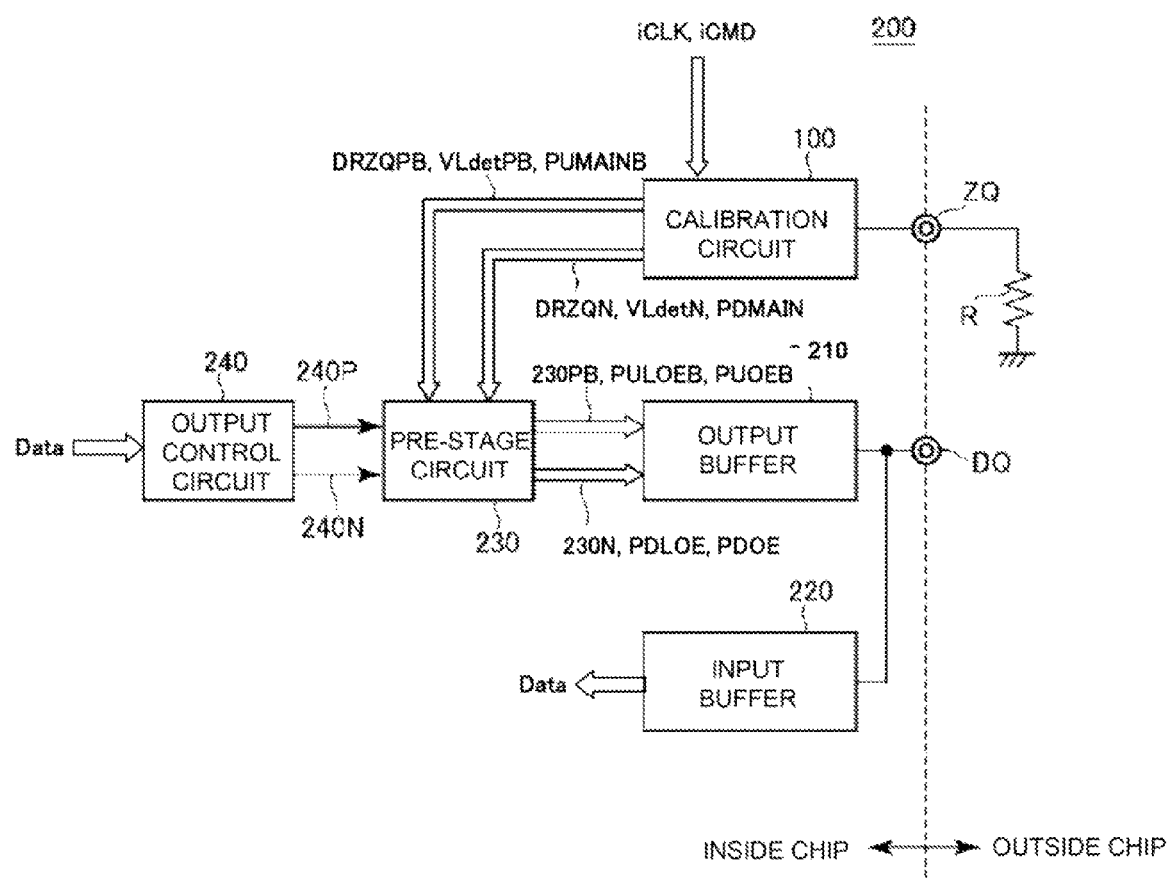
FIG. 3 is a block diagram illustrating a configuration of a data input/output unit in FIG. 2.

Next, the data input/output unit 200 will be described in detail with reference to FIG. 3. FIG. 3 illustrates a configuration of the data input/output unit 200. The data input/output unit 200 includes the calibration circuit 100, the output buffer 210, an input buffer 220, a pre-stage circuit 230, and an output control circuit 240.

The calibration circuit 100 has a function of adjusting the impedance of the output buffer 210 when receiving an internal command iCMD that instructs execution of a calibration operation. On the basis of the external resistor R connected outside the calibration terminal ZQ, the calibration circuit 100 sets impedance control signals DRZQPB ((DRZQPB1 to 5), DRZQN (DRZQN1 to 5)), a low voltage mode signal (VLdetPB, VLdetN), and a main transistor control signal (PUMAINB, PDMAIN) and outputs these signals to the pre-stage circuit 230. The calibration circuit 100 will be described in detail below.

The output control circuit 240 receives a data signal Data outputted from the control circuit unit 20, sets the logic levels of selection signals (240P and 240N) on the basis of the logic level of the data signal Data, and outputs these signals to the pre-stage circuit 230. More specifically, when the data signal Data represents a High level, the output control circuit 240 sets the selection signals 240P and 240N to High and Low levels, respectively. In contrast, if the data signal Data represents a Low level, the output control circuit 240 sets the selection signals 240P and 240N to Low and High levels, respectively.

On the basis of the logic levels of the selection signals 240P and 240N, the pre-stage circuit 230 activates operation signals 230PB or 230N and outputs the activated signals to the output buffer 210. In addition, on the basis of the logic levels of the selection signals 240P and 240N, the pre-stage circuit 230 activates a low-voltage pull-up output enable signal PULOEB or a low-voltage pull-down output enable signal PDLOE and outputs the activated signal to the output buffer 210. In addition, on the basis of the logic levels of the selection signals 240P and 240N, the pre-stage circuit 230 activates a pull-up output enable signal PUOEB or a pull-down output enable signal PDOE and outputs the activated signal to the output buffer 210. The pre-stage circuit 230 will be described in detail below.

The output buffer 210 controls a capability of driving a data input/output terminal DQ on the basis of the above signals (230PB, PULOEB, PUOEB, 230N, PDLOE, and PDOE) supplied from the pre-stage circuit 230. Namely, the output buffer 210 adjusts the output impedance of the data input/output terminal DQ and outputs an output signal corresponding to the data signal Data. The output buffer 210 will be described in detail below.

The input buffer 220 buffers a signal inputted from the data input/output terminal DQ and outputs the signal to the control circuit unit 20 as the data signal Data. Since the configuration of the input buffer 220 does not directly relate to the gist of the present invention, detailed description thereof will be omitted herein.

Next, the calibration circuit 100 will be described with reference to FIG. 4. FIG. 4 illustrates a configuration of the calibration circuit 100. In FIG. 4, the calibration circuit 100 includes replica pre-stage circuits 171 to 173, replica buffers 110, 120, and 130, impedance adjustment circuits 161 and 162, comparison circuits 151 and 152, a reference voltage generation circuit 160, a ZQ control circuit 183, and the calibration terminal ZQ. In FIG. 4, the replica pre-stage circuit 171, the replica buffer 110, the impedance adjustment circuit 161, and the comparison circuit 151 are arranged for adjusting the replica impedance of the pull-up (PU) unit. In contrast, the replica pre-stage circuits 172 and 173, the replica buffer 120 and 130, the impedance adjustment circuit 162, and the comparison circuit 152 are arranged for adjusting the replica impedance of the pull-down (PD) unit.

The replica pre-stage circuit 171 outputs replica control signals 230PRB, PULREB, and PUREB corresponding to the impedance control signal DRZQPB, the low voltage mode signal VLdetPB, and the main transistor control signal PUMAINB outputted by the impedance adjustment circuit 161, respectively, to the replica buffer 110. Likewise, the replica pre-stage circuit 172 outputs the replica control signals 230PRB, PULREB, and PUREB corresponding to the impedance control signal DRZQPB, the low voltage mode signal VLdetPB, the main transistor control signal PUMAINB outputted by the impedance adjustment circuit 161, respectively, to the replica buffer 120. In addition, the replica pre-stage circuit 173 outputs replica control signals 230NR, PDLRE, and PDRE corresponding to the impedance control signal DRZQN, the low voltage mode signal VLdetN, and the main transistor control signal PDMAIN outputted by the impedance adjustment circuit 162, respectively, to the replica buffer 130. The replica pre-stage circuits 171 to 173 will be described in detail below.

The replica buffer 110 drives the calibration terminal ZQ with a replica impedance on the basis of the replica control signals 230PRB, PULREB, and PUREB outputted by the replica pre-stage circuit 171. In addition, the replica buffer 120 drives a node A with a replica impedance on the basis of the replica control signals 230PRB, PULREB, and PUREB outputted by the replica pre-stage circuit 172. In addition, the replica buffer 130 drives the node A with the replica impedance on the basis of the replica control signal 230NR, PDLRE, and PDRE outputted by the replica pre-stage circuit 173. The replica buffer 110, 120, and 130 will be described in detail below.

The reference voltage generation circuit 160 generates a reference voltage VDD/2 and supplies the voltage to a comparison input terminal (−) of each of the comparison circuits 151 and 152.

The comparison circuit 151 receives a voltage at the calibration terminal ZQ via the other comparison input terminal (+) thereof and outputs a comparison result signal COMP1 to the impedance adjustment circuit 161.

The comparison circuit 152 receives a voltage at the node A via the other comparison input terminal (+) thereof and outputs a comparison result signal COMP2 to the impedance adjustment circuit 162.

As illustrated in FIG. 4, the impedance adjustment circuit 161 includes a first and third impedance adjustment circuit 141 and a Pch_LV mode selection circuit (a second impedance adjustment circuit) 181. Likewise, the impedance adjustment circuit 162 includes a first and third impedance adjustment circuit 142 and an Nch_LV mode selection circuit (a second impedance adjustment circuit) 182. The first and third impedance adjustment circuits 141 and 142, the Pch_LV mode selection circuits 181, and the Nch_LV mode selection circuit 182 will be described in detail below.

Among the internal commands iCMD, as an internal ZQ command relating to calibration, there is MZQCS (an internal command based on a ZQ short command ZQCS issued from a memory controller), other than MZQCL (an internal command based on a ZQ long command ZQCL issued from a memory controller). A calibration operation based on the ZQ long command ZQCL is performed for a longer period than a calibration operation based on the ZQ short command ZQCS. For example, the ZQ long command ZQCL is issued during a DRAM initialization operation and the ZQ short command ZQCS is issued periodically during a normal operation.

The ZQ control circuit 183 issues various ZQ control signals ZQCTLP and ZQCTLN on the basis of the internal ZQ commands MZQCL and MZQCS. As to the ZQ control signal ZQCTLP, a ZQ clock ZQCLKP1 is an operation clock for a determination circuit (185 in FIG. 7) and a ZQ clock ZQCLKP2 is an operation clock for a counter circuit (186 in FIG. 7). In addition, a pull-up adjustment active signal ACTP is a signal for activating the replica pre-stage circuit 171 and a reset signal RESET is a signal for resetting the determination circuit (185 in FIG. 7) and the counter circuit (186 in FIG. 7). As to the ZQ control signal ZQCTLN on the pull-down side, similar signals exist.

The ZQ control circuit 183 activates the pull-up adjustment active signal ACTP on the basis of the command MZQCL and the signals ZQCLKP1 and 2 on the basis of a Pch_LV determination mode END signal 199. Both ZQCLKP1 and 2 are based on the internal clock iCLK, and the phase of ZQCLKP1 leads that of ZQCLKP2. This is to stop the operation of the counter circuit (186 in FIG. 7) when the determination circuit (185 in FIG. 7) indicates the end of the calibration.

In addition, when a calibration operation is performed, the ZQ control circuit 183 generates a sense enable signal SENEN on the basis of the internal clock iCLK. The sense enable signal SENEN is a control signal for activating the comparison circuits 151 and 152.

In addition, on the basis of a pull-up determination signal CALENDP, the ZQ control circuit 183 inactivates the ZQ control signal on the PU side and activates a pull-down adjustment start signal NCALSTART and a pull-down adjustment active signal ACTN. This is to perform the ZQ calibration on the PD side after performing the ZQ calibration on the PU side. The subsequent operation on the PD side is substantially the same as that on the PU side.

Next, the Pch_LV mode selection circuit 181 and the Nch_LV mode selection circuit 182 will be described with reference to FIG. 5. FIGS. 5A and 5B are circuit diagrams illustrating details of the Pch_LV mode selection circuit 181 and the Nch_LV mode selection circuit 182, respectively. The Pch_LV mode selection circuit 181 outputs a low voltage mode signal VLdetPB corresponding to the LV MOS transistors 116 of the replica buffers 110 and 120 on the basis of the comparison result signal COMP1. In addition, the Nch_LV mode selection circuit 182 outputs a low voltage mode signal VLdetN corresponding to an LV MOS transistor 136 of the replica buffer 130 on the basis of the comparison result signal COMP2.

As illustrated in FIG. 5A, the Pch_LV mode selection circuit 181 includes an RS-type flip flop circuit (RS-FF) receiving the sense enable signal SENEN and the internal ZQ command MZQCL. An output signal Q from the RS-FF is inputted to a D terminal of a D-type flip flop circuit (D-FF) 195. Since an inverted signal of the sense enable signal SENEN is inputted to the clock input terminal of the D-FF 195, the D-FF 195 latches a falling edge of the sense enable signal SENEN and outputs a signal A. Next, one of the input terminals of a NAND circuit 193 is supplied with the inversion of the logic of the signal A and the other input terminal is supplied with the sense enable signal SENEN. Next, the comparison result signal COMP1 is inputted to the D terminal of a D-FF 196 and an output signal B from the NAND circuit 193 is inputted to the clock input terminal of the D-FF 196. In this way, the Q terminal of the D-FF 196 latches the comparison result signal COMP1 at a falling edge of the signal B and outputs a signal C. Finally, a NAND circuit 194 receives the signal A via one input terminal thereof and the inversion of the logic of the signal C via the other input terminal thereof and outputs the low voltage mode signal VLdetPB.

In addition, FIG. 5B illustrates a circuit diagram of the Nch . . . LV mode selection circuit 182. The Nch_LV mode selection circuit 182 differs from the Pch_LV mode selection circuit 181 in that the Nch_LV mode selection circuit 182 receives the pull-down adjustment start signal NCALSTART in place of MZQCL and uses an AND circuit 294 in place of the NAND circuit 194. The AND circuit 294 is used to set the low voltage mode signal VLdetN to a Low level in an LV determination period and to generate a signal having the same logic as that from the Pch_LV mode selection circuit 181 after the LV determination period.

Next, an operation in FIG. 5A will be described with reference to FIG. 6. FIG. 6 is a waveform diagram illustrating an operation of the Pch . . . LV mode selection circuit in FIG. 5. At timing t1 in FIG. 6, the ZQ command MZQCL is issued and a one-shot pulse is generated. In response, the RS-FF is reset to a Low level. After timing t2, the sense enable signal SENEN represents pulses at predetermined intervals. At timing t2, in response to the first pulse of the sense enable signal SENEN, the RS-FF is set and the output signal Q thereof is set to a High level. In FIG. 6, $\tau$ represents a delay caused in the RS-FF. In addition, the sense enable signal SENEN is inputted to the comparison circuits (151 and 152 in FIG. 4). When the sense enable signal SENEN is set to a High level, the comparison circuits are activated. The period between timing t2 and timing t3 during which the sense enable signal SENEN is first activated is an LV determination period (corresponding to S10 and S11 in FIG. 14). More specifically, in this period, on/off of the LV MOS transistors is first determined.

Next, at timing t3, since the sense enable signal SENEN falls, the output Q of the RS-FF is latched and the signal A is set to a High level. At timing t3 in FIG. 6, when the LV determination period ends, the Pch_LV mode selection circuit 181 outputs the signal A to the ZQ control circuit 183 as a the Pch_LV determination mode END (199) indicating the end of the LV determination period.

The signal B is set to a Low level between (t2+$\tau$) and t3 and to a High level in any other period. The signal C is a signal obtained by latching the comparison result signal COMP1 at a falling edge of the signal B (namely, at timing t2+$\tau$). Namely, the signal C is obtained by latching the comparison result signal COMP1 in the LV determination period and the value of the signal C is held thereafter.

Finally, VLdetPB is maintained at a High level irrespective of the comparison result signal COMP1 until timing t3, until which the signal A is maintained at a Low level. In addition, after timing t3, VLdetPB represents the same logic level as that of the comparison result signal COMP1.

FIG. 6 illustrates waveforms of the comparison result signal COMP1, the signal C, and the low voltage mode signal VLdetPB when the comparison determination result COMP1 is a Low level and is a High level in the LV determination period. In either case, the low voltage mode signal VLdetPB represents a High level until timing t3. However, after timing t3, the low voltage mode signal VLdetPB represents a different value, depending on the comparison determination result COMP1 in the LV determination period.

Figure 7:
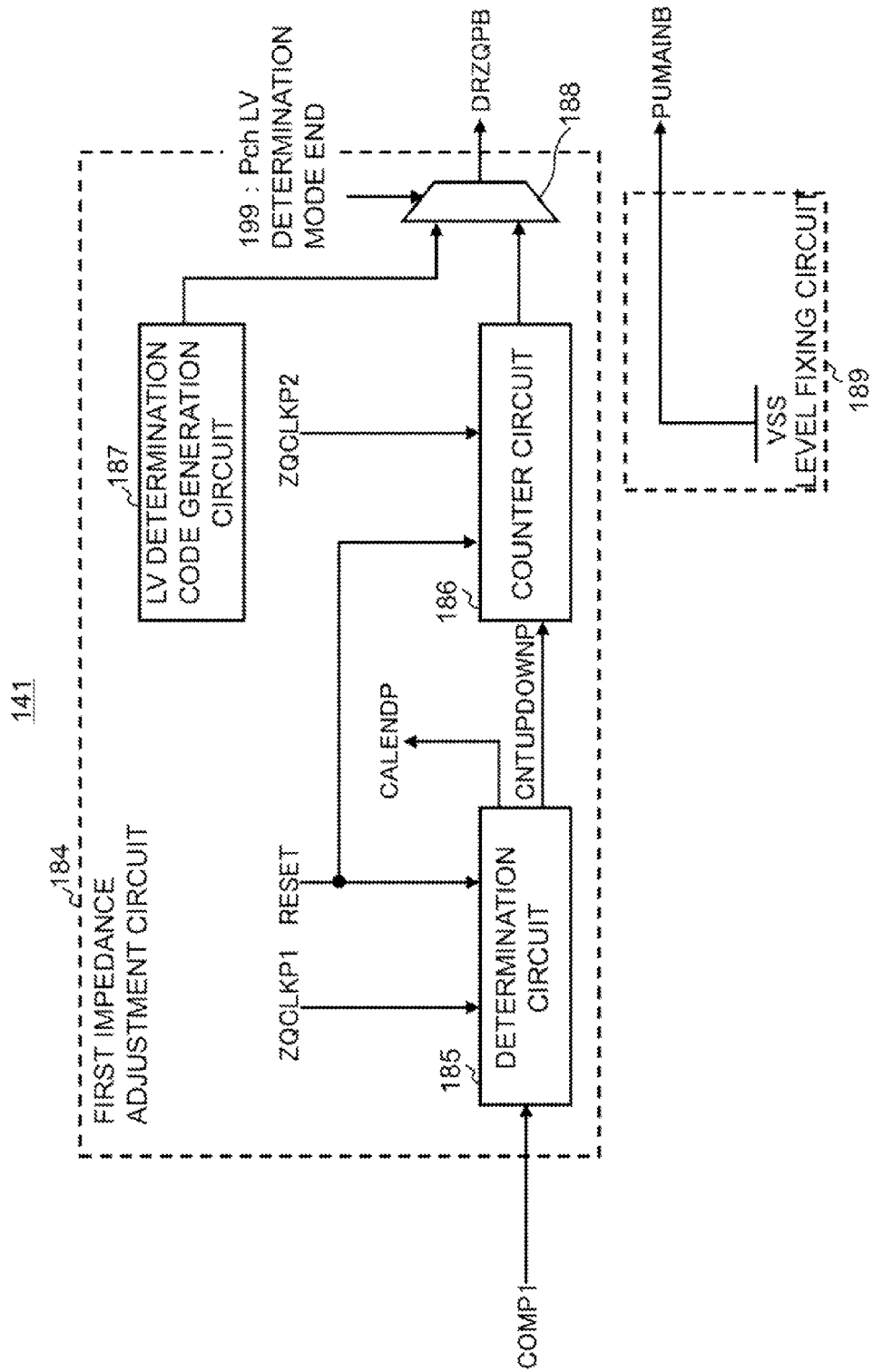
FIG. 7 is a block diagram illustrating a configuration of a first and third impedance adjustment circuit on the Pch side in FIG. 4.

Next, a configuration of the first and third impedance adjustment circuit 141 on the pull-up side will be described with reference to FIG. 7. In FIG. 7, the first and third impedance adjustment circuit 141 includes a first impedance adjustment circuit 184 and a level fixing circuit (a third impedance adjustment circuit) 189. The first impedance adjustment circuit 184 includes the determination circuit 185, the counter circuit 186, an LV determination code generation circuit 187, and a selector 188.

The determination circuit 185 determines whether the replica impedance of the replica circuit 110 crosses the impedance of the external resistor R after the replica impedance is adjusted. More specifically, if the logic level of the comparison result signal COMP1 changes, the determination circuit 185 generates the determination signal CALENDP and notifies the ZQ control circuit 183 of completion of the adjustment of the replica impedance.

Next, the relationship between the comparison result signal COMP1 and a count-up/down signal CNTUPDOWNP will be described. First, if the potential at the terminal ZQ is lower than VDD/2, the comparison result signal COMP1 represents a Low level. This means that the replica impedance of the replica circuit 110 is larger than the external resistor R. Thus, to decrease the replica impedance, the PMOS transistors 111 to 115 of the replica circuit 110 need to be adjusted so that the number of PMOS transistors 111 to 115 that are set to on is increased. Namely, a count-down operation needs to be performed on the impedance control signals DRZQPB. Thus, the determination circuit 185 is configured to set the count-up/down signal CNTUPDOWNP to a Low level and the counter circuit 186 is configured to perform a count-down operation upon receiving the Low-level count-up/down signal CNTUPDOWNP when COMP1 is at a Low level. In contrast, the determination circuit 185 is configured to set the count-up/down signal CNTUPDOWNP to a High level and the counter circuit 186 is configured to perform a count-up operation upon receiving the High-level count-up/down signal CNTUPDOWNP when COMP1 is at a High level.

The counter circuit 186 operates in synchronization with the ZQ clock ZQCLKP2 and changes its own count values on the basis of the logic level of the count-up/down signal CNTUPDOWNP. The count values of the counter circuit 186 are supplied to one input terminal of the selector 188.

Next, the LV determination code generation circuit 187 will be described. The LV determination code generation circuit 187 has a function of setting all the PMOS transistors 111 to 115 (fourth transistors) in the replica circuit 110 to on in an LV determination period. This is, as described in the description of the principle, to set all the transistors other than the LV MOS transistor to on in step S10 in FIG. 14. More specifically, the LV determination code generation circuit 187 generates #00 (a signal representing that all the five bits are at a Low level) and supplies #00 to the other input terminal of the selector 188.

Next, as a selection signal of the selector 188, the Pch_LV determination mode END (199) is supplied. The selector 188 selectively outputs the signal from the LV determination code generation circuit 187 in an LV determination period and selectively outputs the signal from the counter circuit 186 after the LV determination period.

In addition, the level fixing circuit 189 in FIG. 7 outputs the main transistor control signal PUMAINB that is always at the potential VSS.

Next, the first and third impedance adjustment circuit 142 on the PD side will be described with reference to FIG. 8. Since the first and third impedance adjustment circuit 142 on the PD side has the same configuration as that of the first and third impedance adjustment circuit 141 on the PU side illustrated in FIG. 7, redundant description thereof will be omitted. The first and third impedance adjustment circuit 142 is supplied with the signals COMP2, ZQCLKN1, ZQCLKN2, Nch_LV determination mode END (299) in place of the signals COMP1, ZQCLKP1, ZQCLKP2, and Pch_LV determination mode END (199) in FIG. 7. In addition, the first and third impedance adjustment circuit 142 outputs the signals DRZQN and PDMAIN, in place of the DRZQPB and PUMAINB in FIG. 7.

Figure 8:
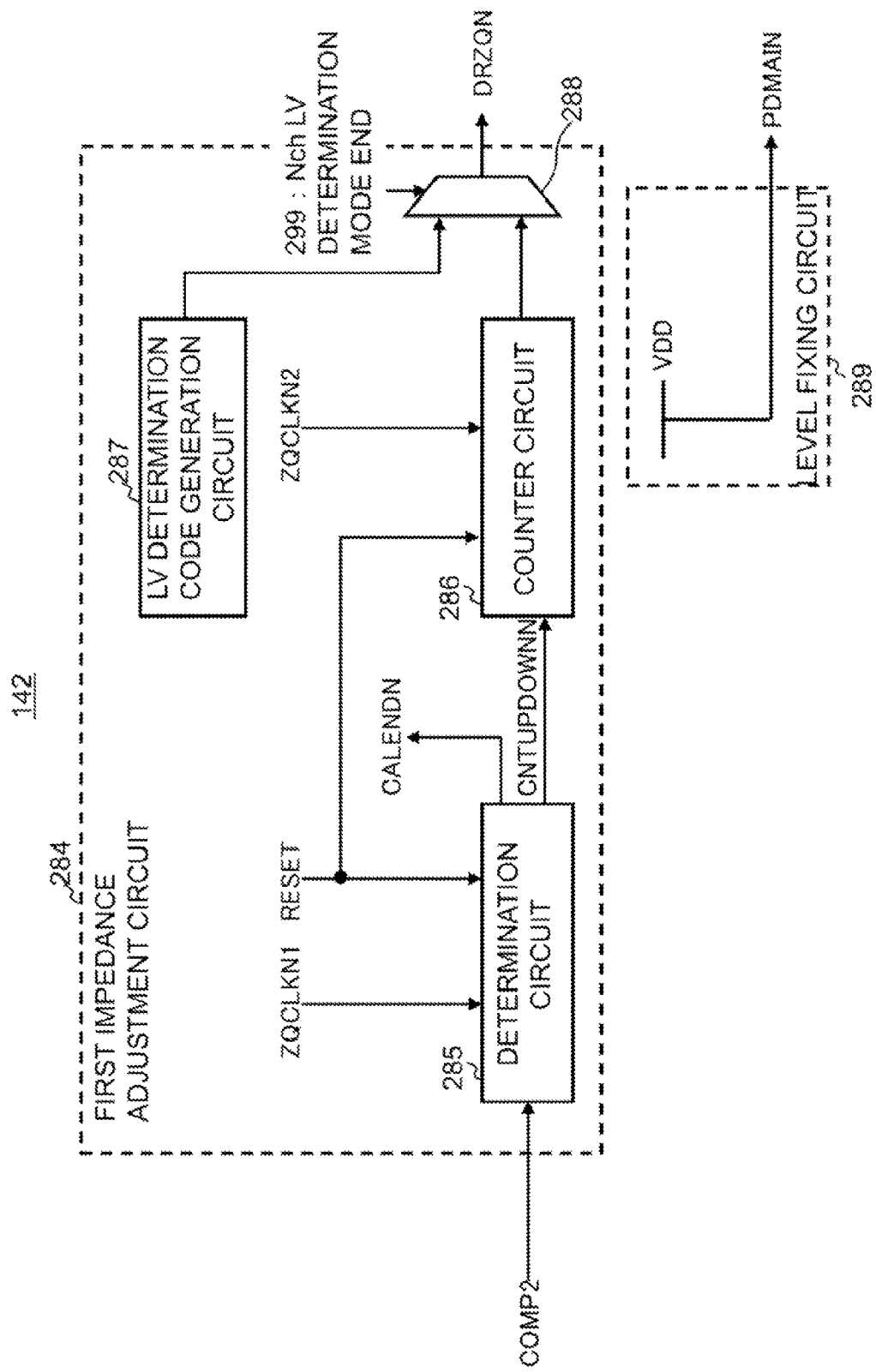
FIG. 8 is a block diagram illustrating a configuration of a first and third impedance adjustment circuit on the Nch side in FIG. 4.

In addition, an LV determination code generation circuit 287 in FIG. 8 has a function of setting NMOS transistors 131 to 135 (fourth transistors) in the replica circuit 130 in FIG. 10B to on. This is to set all the transistors other than the LV MOS transistor to on. Since these transistors are NMOS transistors, the LV determination code generation circuit 287 generates #1F (a signal representing that all the five bits are at a High level).

In addition, a level fixing circuit 289 in FIG. 8 outputs a main transistor control signal PDMAIN that is always at the potential VDD.

Next, the relationship between the comparison result signal COMP2 and a count-up/down signal CNTUPDOWNN will be described. As illustrated in FIG. 4, COMP2 is a comparison result signal obtained by comparing the potential at the node A with the potential VDD/2 generated by the reference voltage generation circuit 160. In the present ZQ calibration, the calibration circuit 100 first performs impedance adjustment in the PU unit and next performs impedance adjustment in the PD unit. More specifically, the first half of the impedance adjustment is performed on the replica buffer 110 in the PU unit so that the impedance of the replica buffer 110 is matched to be equal to the external resistor R. Next, in the second half of the impedance adjustment performed on the PD unit, the replica buffer 120 is deemed to have been set with the same setting as that of the adjusted replica buffer 110, and the impedance of the replica buffer 130 in the PD unit is matched to be equal to that of the replica buffer 120.

In the above second half of the impedance adjustment performed on the PD unit, if the potential at the node A is smaller than VDD/2, the comparison result signal COMP2 is set to a Low level. This means that the replica impedance of the replica buffer 130 is smaller than the replica impedance of the replica buffer 120. Thus, to increase the replica impedance of the replica buffer 130, the NMOS transistors 131 to 135 in the replica circuit 130 need to be adjusted so that the number of NMOS transistors 131 to 135 that are set to on is decreased. Namely, a count-down operation needs to be performed on the impedance control signals DRZQN. Thus, a determination circuit 285 is configured to set the count-up/down signal CNTUPDOWNN to a Low level and a counter circuit 286 is configured to perform a count-down operation upon receiving the Low-level count-up/down signal CNTUPDOWNN when COMP2 is at a Low level. In contrast, the determination circuit 285 is configured to set the count-up/down signal CNTUPDOWNN to a High level and the counter circuit 286 is configured to perform a count-up operation upon receiving the High-level count-up/down signal CNTUPDOWNN when the comparison result signal COMP2 is at a High level. Namely, the relationship between the comparison result signal COMP2 and the count-up/down signal CNTUPDOWNN needs to be the same as that between the comparison result signal COMP1 and the count-up/down signal CNTUPDOWNP in FIG. 7.

Next, the replica pre-stage circuits 171 to 173 will be described with reference to FIG. 9. FIGS. 9A to 9C are circuit diagrams of the replica pre-stage circuits 171 to 173, respectively. First, the replica pre-stage circuit 171 illustrated in FIG. 9A will be described. The replica pre-stage circuit 171 has substantially the same configuration as that of the PU unit in the pre-stage circuit (230 in FIG. 11; details thereof will be described below) in the data input/output unit 200. Namely, a circuit formed by cascading the replica pre-stage circuit 171 and the replica buffer 110 has the same configuration as that of a circuit formed by cascading the PU unit in the pre-stage circuit 230 and the PU unit in the output buffer 210.

Figure 9A:
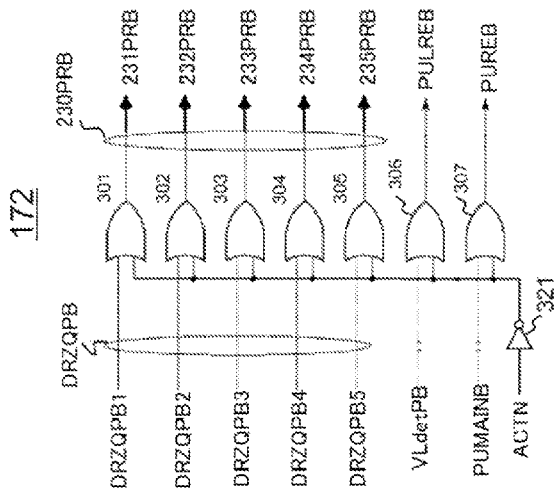
FIGS. 9A to 9C are circuit diagrams of replica pre-stage circuits in FIG. 4.

As illustrated in FIG. 9A, the replica pre-stage circuit 171 includes seven OR circuits 301 to 307 and an inverter circuit 321. The logic of the pull-up adjustment active signal ACTP from the ZQ control circuit 183 is inverted by the inverter circuit 321, and this inverted signal is commonly supplied to one input terminal of each of the OR circuits 301 to 307. In addition, the other input terminal of each of the OR circuits 301 to 307 is supplied with the impedance control signals DRZQPB (DRZQPB1 to 5), the low voltage mode signal VLdetPB, and the main transistor control signal PUMAINB from the impedance adjustment circuit 161, respectively. The OR circuits 301 to 307 output the replica control signals 230PRB (231PRB to 235PRB), PULREB, and PUREB to the replica buffer 110, respectively.

The pull-up adjustment active signal ACTP is a signal activated to a High level when the replica impedance in the PU unit is adjusted. When ACTP is at a High level, the OR circuits 301 to 307 output 230PRB (231PRB to 235PRB), PULREB, and PUREB equal to DRZQPB (DRZQPB1 to 5), VLdetPB, and PUMAINB, respectively. In contrast, if ACTP is at a Low level, the signals outputted from these OR circuits 301 to 307 are inactivated to a High level.

Figure 9B:
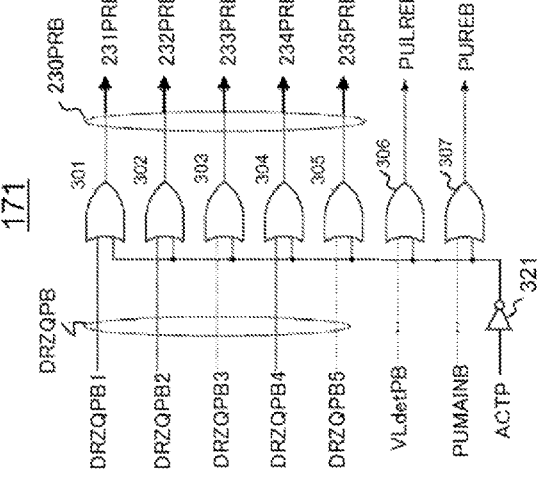

The configuration of the replica pre-stage circuit 172 in FIG. 9B is the same as that of the replica pre-stage circuit 171 in FIG. 9A, with the exception that the pull-down adjustment active signal ACTN is supplied in place of the pull-up adjustment active signal ACTP. Since the replica circuit 120 connected to the replica pre-stage circuit 171 is used when the PD-side adjustment is performed, the pull-down adjustment active signal ACTN is supplied to the replica pre-stage circuit 172.

Next, the replica pre-stage circuit 173 illustrated in FIG. 9C will be described. The replica pre-stage circuit 173 has substantially the same configuration as that of the PD unit in the pre-stage circuit (230 in FIG. 1; details thereof will be described below) in the data input/output unit 200. Namely, a circuit formed by cascading the replica pre-stage circuit 173 and the replica buffer 130 has the same configuration as that of a circuit formed by cascading the PD unit in the pre-stage circuit 230 and the PD unit in the output buffer 210.

Figure 9C:
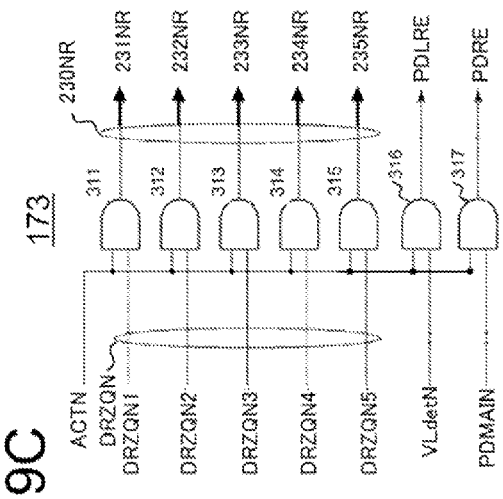

As illustrated in FIG. 9C, the replica pre-stage circuit 173 includes seven AND circuits 311 to 317. The pull-down adjustment active signal ACTN from the ZQ control circuit 183 is commonly supplied to one input terminal of each of the AND circuits 311 to 317. In addition, the other input terminal of each of the AND circuits 311 to 317 is supplied with the impedance control signals DRZQN (DRZQN1 to 5), the low voltage mode signal VLdetN, and the main transistor control signal PDMAIN from the impedance adjustment circuit 162, respectively. The AND circuits 311 to 317 output the replica control signals 230NR (231NR to 235NR), PDLRE, and PDRE to the replica buffer 130, respectively.

Next, configurations of the replica buffers 110, 120, and 130 will be described with reference to FIG. 10. FIG. 10A is a circuit diagram illustrating a configuration of the PU-side replica buffer 110. The replica buffer 110 is a replica circuit of the PU unit in the output buffer 210. As illustrated in FIG. 10A, the replica buffer 110 includes seven PMOS transistors 111 to 117 connected in parallel to each other and the resistor 119 having one end connected to a drain of each of these transistors. The other end of the resistor 119 is connected to the calibration terminal ZQ.

As described in the description of the principle, among the seven PMOS transistors, on/off of the PMOS transistors 111 to 115 is adjusted individually to adjust the impedance of the output buffer 210. The replica buffer 110 also includes the LV MOS transistor 116 and the main transistor 117 that is set to an on-state in a pull-up operation. The replica control signals 230PRB (231PRB to 235PRB), PULREB, and PUREB are supplied from the replica pre-stage circuit 171 to gates of the PMOS transistors 111 to 117, respectively.

The parallel circuit formed by the PMOS transistors 111 to 117 is designed to have a predetermined impedance (for example 120Ω) when the PU side is selected. However, transistors have different on-resistances depending on manufacturing conditions. In addition, the on-resistances vary depending on the temperature of the environment when operated or depending on a power supply voltage. Namely, the predetermined impedance cannot necessarily be obtained. Thus, to actually set the impedance to 120Ω, the number of transistors that need to be on is adjusted by using the method described in the description of the principle (see FIG. 14). In addition, the resistance value of the resistor 119 is designed to 120Ω, for example. In this way, the impedance of the replica buffer 110 seen from the calibration terminal ZQ is set to 240 Ω.

The replica buffer 120 has the same circuit configuration as that of the replica buffer 110 illustrated in FIG. 10A, with the exception that the other end of the resistor 119 is connected to the node A. In addition, the seven PMOS transistors 111 to 117 in the replica buffer 120 are supplied with the same replica control signals as those supplied to the replica buffer 110. Thus, when the impedance of the replica buffer 110 reaches 240Ω, the impedance of the replica buffer 120 seen from the node A also reaches 240 Ω.

FIG. 10B is a circuit diagram of the replica buffer 130 on the PD side. As illustrated in FIG. 10B, the replica buffer 130 includes seven NMOS transistors 131 to 137 connected in parallel to each other and a resistor 139 having one end connect to a drain of each of these transistors. The other end of the resistor 139 is connected to the node A.

It is preferable that the W/L ratios of the seven PMOS transistors ill to 117 in the replica buffer 110 be set as follows. Namely, the W/L ratios of the PMOS transistors 112 to 115 are set to twice, four times, eight times, and 16 times that of the PMOS transistor 111, respectively. In this way, the step widths in a count-up/down operation of a counter circuit can be made even. In addition, as described in the description of the principle, since the LV MOS transistor 116 is for roughly selecting the impedance adjustment range, it is desirable that the W/L ratio of the LV MOS transistor 116 be set to be larger than any one of the PMOS transistors 111 to 115 (namely, a smaller on-resistance). For example, the W/L ratio of the LV MOS transistor 116 is set 32 times as large as the W/L ratio of the PMOS transistor 111. In addition, it is preferable that the W/L ratio of the main transistor 117 be set to be even larger than that of the LV MOS transistor 116 to obtain a value close to 120Ω. In this way, one step in the impedance adjustment by the PMOS transistors 111 to 116 can be reduced, and the accuracy in calibration can be improved.

It is also desirable that the W/L ratios of the seven NMOS transistors 131 to 137 in the PD-side replica buffer 130 be set in the same way as the PMOS transistors 111 to 117 are set for the same reasons.

The replica control signals 230NR (231NR to 235NR), PDLRE, and PDRE are supplied from the replica pre-stage circuit 173 to gates of the NMOS transistors 131 to 137, respectively.

The parallel circuit formed by the NMOS transistors 131 to 137 is also designed to have a predetermined impedance (for example, 120Ω) when the PD side is selected. To actually set the impedance to 120Ω, the number of transistors that need to be on is adjusted in the same way as in the impedance adjustment on the PU side. In addition, the resistance value of the resistor 139 is designed to 120Ω, for example. In this way, the impedance of the replica buffer 130 seen from the calibration terminal ZQ is set to 240Ω, as with the case of the replica buffer 120.

Figure 11:
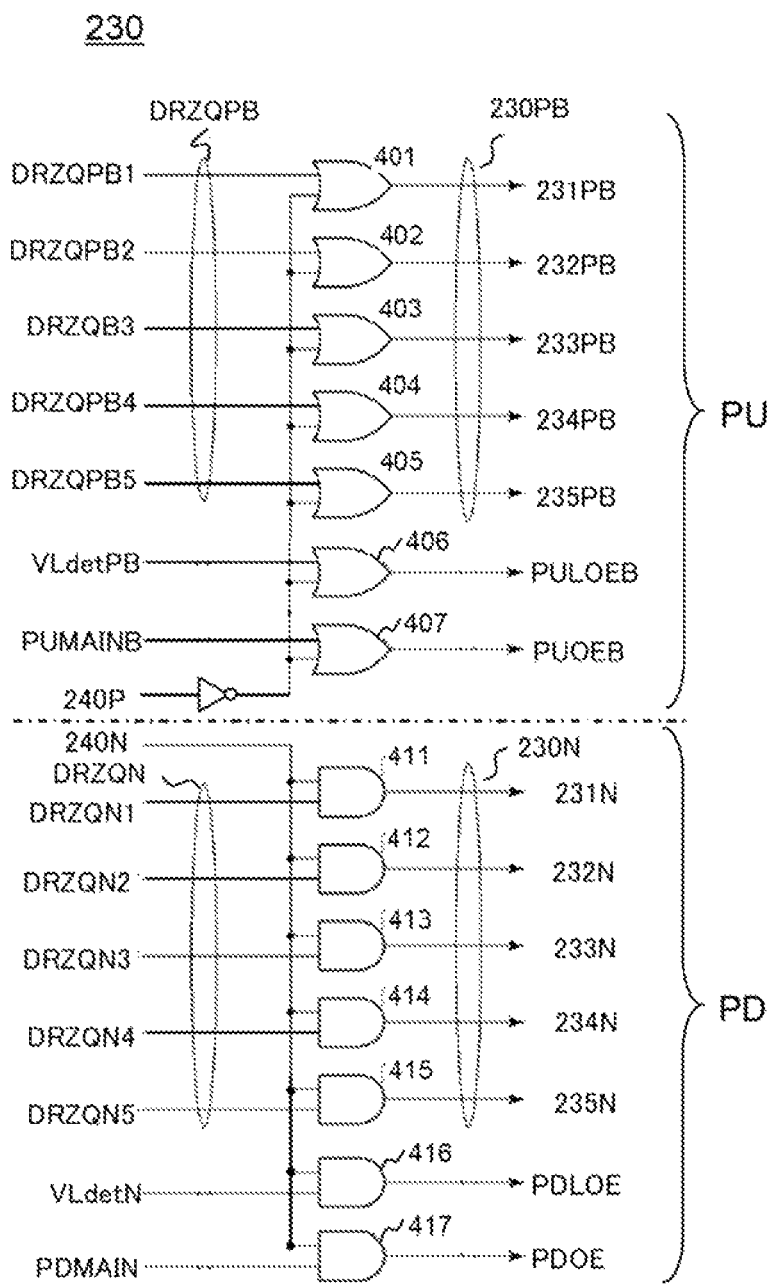
FIG. 11 is a circuit diagram of a pre-stage circuit in FIG. 3.

Next, a configuration of the pre-stage circuit 230 will be described with reference to FIG. 11. The pre-stage circuit 230 has a function of supplying various types of output control signals to the output buffer 210. In addition, the replica pre-stage circuits 171 to 173 (FIG. 9), which have already been described, are replica circuits of this pre-stage circuit 230. In FIG. 11, the PU unit in the pre-stage circuit 230 has the same configuration as that of the replica pre-stage circuit 171. In addition, the PD unit in the pre-stage circuit 230 has the same configuration as that of the replica pre-stage circuit 173. Thus, detailed description of FIG. 11 will be omitted. The output control signals outputted by the PU unit in the pre-stage circuit 230 are the operation signals 230PB (231PB to 235PB), the low-voltage pull-up output enable signal PULOEB, and the pull-up output enable signal PUOEB, which are supplied to the PU unit in the output buffer 210. In addition, the output control signals outputted by the PD unit in the pre-stage circuit 230 are the operation signals 230N (231N to 235N), the low-voltage pull-down output enable signal PDLOE, pull-down output enable signal PDOE, which are supplied to the PD unit in the output buffer 210.

Next, a configuration of the output buffer 210 will be described with reference to FIG. 12. As illustrated in FIG. 12, the output buffer 210 includes a PU unit and a PD unit. The PU unit has the same configuration as that of the output circuit 310 in FIG. 1. The PU unit in FIG. 12 includes seven PMOS transistors 211P to 217P connected in parallel to each other. In addition, the PD unit includes seven NMOS transistors 211N to 217N connected in parallel to each other. Resistors 218 and 219 are connected in series with each other between the set of PMOS transistors 211P to 217P and the set of NMOS transistors 211N to 217N, and the connection between the resistors 218 and 219 is connected to the data input/output terminal DQ.

In the PU unit, among the seven PMOS transistors, on/off of the transistors 211P to 215P is adjusted individually, the transistor 216P is an LV MOS transistor, and the transistor 217P is a main transistor that is set to an on-state in a pull-up operation. The transistors 211P to 217P correspond to the transistors 111 to 117 in the replica buffer 110, respectively. In addition, in the PD unit, among the seven NMOS transistors, on/off of the transistors 211N to 215N is adjusted individually, the transistor 216N is an LV MOS transistor, and the transistor 217N is a main transistor that is set to an on-state in a pull-down operation. The transistors 211N to 217N correspond to the transistors 131 to 137 in the replica buffer 130, respectively.

The PU unit in the output buffer 210 receives the result of ZQ calibration using the replica buffer 110. Namely, on/off setting of the PMOS transistors 211P to 217P is made in the same way as that of the PMOS transistors 111 to 117 in the replica buffer 110. Thus, if the replica impedance of the replica buffer 110 is adjusted to the external resistor R (for example, 240Ω), the impedance of the PU unit in the output buffer 210 seen from the input/output terminal DQ is deemed to have been adjusted to 240 Ω.

The PD unit in the output buffer 210 receives the result of ZQ calibration using the replica buffer 130. Namely, on/off setting of the NMOS transistors 211N to 217N is made in the same way as that of the NMOS transistors 131 to 137 in the replica buffer 130. Thus, if the replica impedance of the replica buffer 130 is adjusted to the replica impedance of the adjusted replica buffer 120, the impedance of the PD unit in the output buffer 210 seen from the input/output terminal DQ is also deemed to have been adjusted to 240 Ω.

(Operation of First Exemplary Embodiment)

Figure 13:
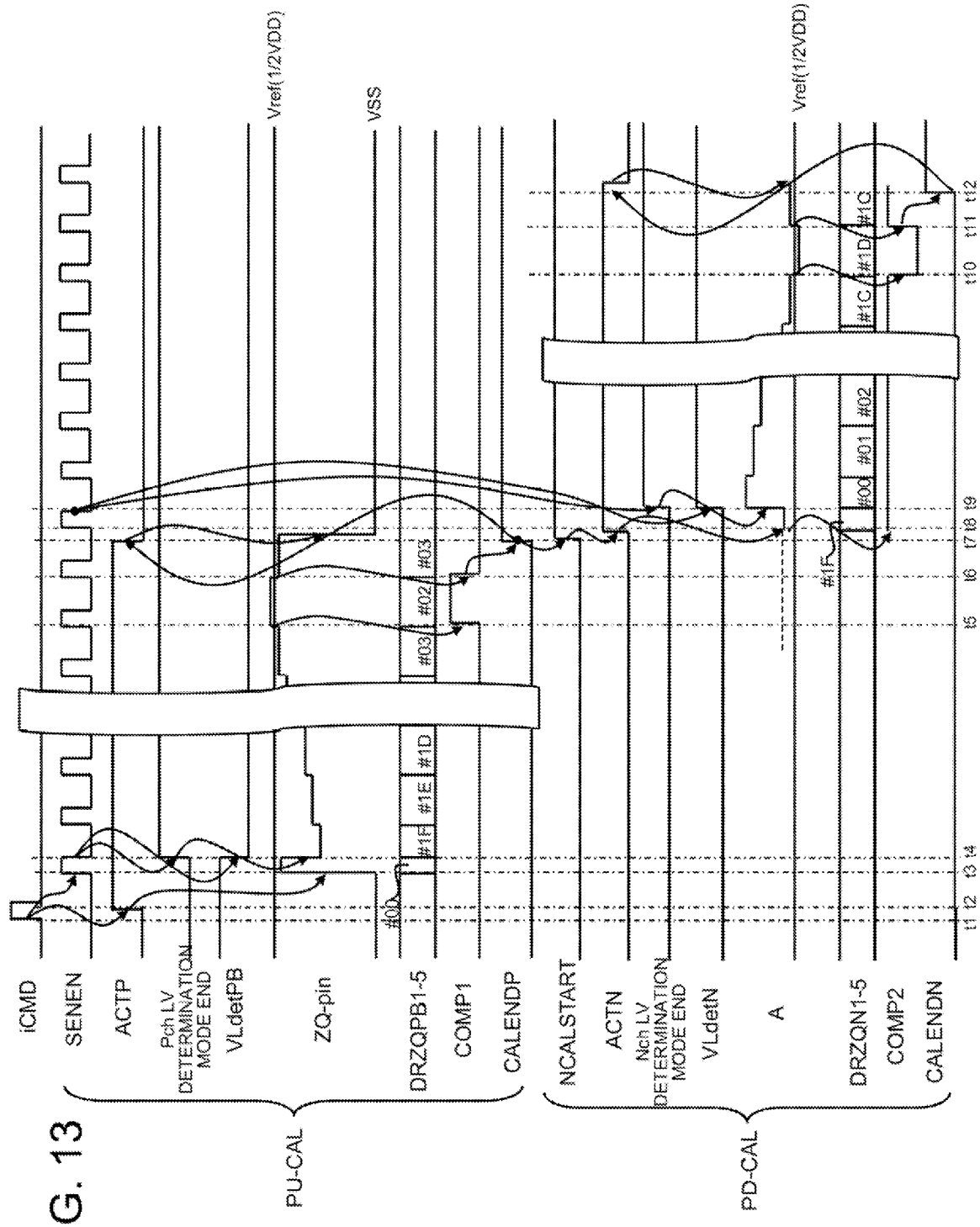
FIG. 13 is a waveform diagram illustrating an operation of the calibration circuit in the semiconductor device according to the first exemplary embodiment.

Next, an example of a calibration operation of the semiconductor device 10 according to the first exemplary embodiment will be described with reference to FIG. 13. FIG. 13 is a waveform diagram illustrating a waveform of each element. In FIG. 13, after ZQ calibration is performed on the PU unit (PU-CAL in FIG. 13), ZQ calibration is performed on the PD unit (PD-CAL in FIG. 13). Since iCMD, SENEN, and Pch LV determination mode END in FIG. 13 are the same as those in the waveform in FIG. 6, redundant description thereof will be omitted.

When an internal command iCMD is issued, at timing t2, the pull-up adjustment active signal ACTP is activated to a High level. Next, after timing t3, the sense enable signal SENEN represents pulses at intervals. As illustrated in FIG. 6, the first pulse (between timing t3 and t4) corresponding to when the signal SENEN represents a High level is an LV determination period of calibration performed on the PU unit (PU-CAL). In this LV determination period, to set the PMOS transistors 111 to 115 in the replica buffer 110 to on, the five bits of the signals DRZQPB are set to #00. FIG. 13 illustrates a case in which the comparison result signal COMP1 is set to a Low level in this LV determination period. This corresponds to a case in which Zmin0>external resistor R in S11 in FIG. 14. Since COMP1 is at a Low level in the LV determination period, VLdetPB is set to a Low level after timing t4.

In addition, after timing t4, on/off adjustment of the PMOS transistors 111 to 115 in the replica buffer 110 is started. The initial values of the impedance control signals DRZQPB are set to #1F. Namely, a maximum impedance that can be obtained when the LV MOS transistor is set to on is set.

The comparison result signal COMP1 is at a Low level between timing t4 and t5. In response to this low-level signal COMP1, the counter circuit 186 performs a count-down operation so that the replica impedance of the replica buffer 110 is adjusted to be lower. The potential at the ZQ terminal is increased gradually along with the decrease of the replica impedance. Next, when the comparison result signal COMP1 is switched from a Low level to a High level at timing t5, the counter circuit 186 switches its operation to a count-up operation. Next, at timing t6, the comparison result signal COMP1 returns to a Low level. In response to this Low-level signal COMP1, at timing t7, the determination circuit 185 determines that the impedance adjustment has been completed, activates the pull-up determination signal CALENDP to a High level, and outputs this signal CALENDP to the ZQ control circuit 183. When receiving the pull-up determination signal CALENDP, the ZQ control circuit 183 inactivates the pull-up adjustment active signal ACTP. In response to the inactivation of the pull-up adjustment active signal ACTP, the replica pre-stage circuit 171 inactivates the replica control signals. As a result, the parallel connection portion in the replica buffer 110 is set to be in a non-conductive state, and the potential at the ZQ terminal is decreased to VSS.

After timing t8, ZQ calibration is performed on the PD unit. At timing t7, the ZQ control circuit 183 activates the signal NCALSTART for instructing the start of the ZQ calibration on the PD unit to a High level and outputs the activated signal NCALSTART to the Nch mode selection circuit 182. Accordingly, the Nch mode selection circuit 182 is activated. Thereafter, the period when the first pulse of the sense enable signal SESEN represents a High level (between timing t8 and t9) is an LV determination period. In this LV determination period, to set the NMOS transistors 131 to 135 in the replica buffer 130 to on, the five bits of the signals DRZQN are set to #1F. FIG. 13 illustrates a case in which the comparison result signal COMP2 is set to a High level in this LV determination period. This corresponds to a case in which Zmin0>replica impedance (already adjusted to the external resistor R) of the replica buffer 120. Since COMP2 is at a High level in the LV determination period, the low voltage mode signal VLdetN is set to a High level after timing t9.

After timing t9, on/off adjustment of the NMOS transistors 131 to 135 in the replica buffer 130 is started. The initial values of the impedance control signals DRZQN are set to #00. Namely, a maximum impedance that can be obtained when the LV MOS transistor is set to on is set.

The comparison result signal COMP2 is at a High level between timing t9 and t10. In response to this high-level signal COMP2, the counter circuit 286 performs a count-up operation so that the replica impedance of the replica buffer 130 is adjusted to be lower. The potential at the node A is decreased gradually along with the decrease of the replica impedance. Next, when the comparison result signal COMP2 is switched from a High level to a Low level at timing t10, the counter circuit 286 switches its operation to a count-down operation. Next, at timing t11, the comparison result signal COMP2 returns to a High level. In response to this high-level signal COMP2, at timing t11, the determination circuit 285 determines that the impedance adjustment has been completed, activates the pull-down determination signal CALENDN to a High level, and outputs this signal CALENDN to the ZQ control circuit 183. When receiving the pull-down determination signal CALENDN, the ZQ control circuit 183 inactivates the pull-down adjustment active signal ACTN at timing t12. In response to the inactivation of the pull-down adjustment active signal ACTN, the replica pre-stage circuit 173 inactivates the replica control signals. As a result, both the replica buffers 130 and 120 are set to be in a non-conductive state, and the node A is set in a floating state.

In this way, the ZQ calibration has been completed. The impedance control signals DRZQPB (#03), the signal VLdetPB (Low level), the impedance control signals DRZQN (#1C), and the signal VLdetN (High level), which are ZQ calibration adjustment results, are supplied to the pre-stage circuit 230, and the ZQ calibration adjustment results are reflected on the output buffer 210.

As described above, the semiconductor device 10 according to the first exemplary embodiment includes an LV MOS transistor (216P, 216N) is added to a parallel connection portion formed by a plurality of transistors in the output buffer 210, so as to prevent deterioration of the lower limit margin in impedance adjustment when the semiconductor device is used at a low power supply voltage. A control terminal (gate) of the LV MOS transistor (216P, 216N) is configured to receive a second output control signal (the low-voltage pull-up enable signal PULOEB, the low-voltage pull-down enable signal PDLOE) generated on the basis of a data signal Data and a second impedance adjustment signal (the low voltage mode signal VLdetPB, VLdetN). In this way, since on/off control of the LV MOS transistor (216P, 216N) can be performed on the basis of the above output control signal (PULOEB, PDLOE), it is possible to avoid a significant increase of the adjustment period of the impedance adjustment by addition of the LV MOS transistor (216P, 216N). Namely, the semiconductor device 10 according to the first exemplary embodiment can contribute to prevention of deterioration of the lower limit margin in impedance adjustment without decreasing the accuracy of the impedance adjustment and without significantly increasing the adjustment period when the semiconductor device is used at a low power supply voltage.

In addition, with this semiconductor device 10 according to the first exemplary embodiment, the minimum impedance Zmin0 obtained when the LV MOS transistor is set to off and the other transistors connected in parallel to each other are set to off is compared with a desired value. If the minimum impedance Zmin0 is larger than the desired value, the LV MOS transistor is set to on and on/off of the other transistors connected in parallel to each other is adjusted. In contrast, if the minimum impedance Zmin0 is smaller than the desired value, the LV MOS transistor is set to off and on/off of the other transistors connected in parallel to each other is adjusted. Thus, the increase of the number of comparisons by a comparison circuit along with the addition of the LV MOS transistors can be minimized to one. Namely, a significant increase of the adjustment period can be avoided.

In addition, according a method for adjusting the impedance of an output circuit according to the first exemplary embodiment, the increase of the number of comparisons by the addition of the LV MOS transistors can be minimized to one (step S1 in FIG. 14). Even when the LV MOS transistors are added to avoid the deterioration of the lower limit margin in impedance adjustment when the output circuit is used at a low power supply voltage, the adjustment period is not significantly increased. Namely, the method for adjusting the impedance of an output circuit according to the first exemplary embodiment can contribute to prevention of deterioration of the lower limit margin in impedance adjustment without decreasing the accuracy of the impedance adjustment and without significantly increasing the adjustment period when the output circuit is used at a low power supply voltage.

Second Exemplary Embodiment

Figure 16:
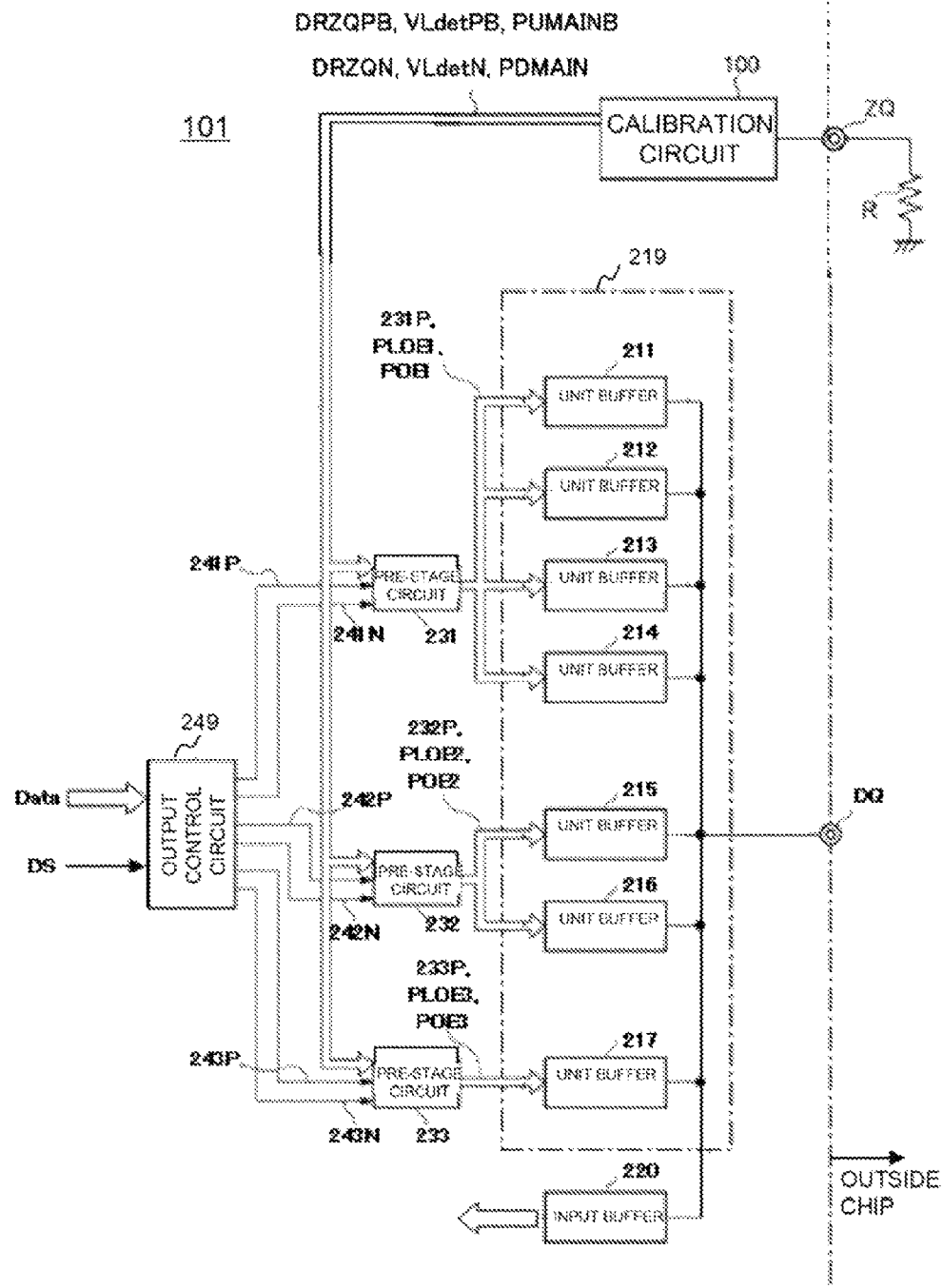
FIG. 16 is a block diagram illustrating a configuration of a semiconductor device according to a second exemplary embodiment.

Next, a semiconductor device 101 according to a second exemplary embodiment will be described with reference to FIG. 16. FIG. 16 is a block diagram illustrating a configuration of the semiconductor device 101 according to the second exemplary embodiment.

In the second exemplary embodiment in FIG. 16, an output buffer 219, pre-stage circuits 231 to 233, and an output control circuit 249 are used, in place of the output buffer 210, the pre-stage circuit 230, and the output control circuit 240. The output buffer 219 includes a plurality of unit buffers 211 to 217, each of which has substantially the same configuration as that of the output buffer 210 (FIG. 12) according to the first exemplary embodiment.

The pre-stage circuits 231 to 233 control the unit buffers 211 to 214, the unit buffers 215 and 216, and the unit buffer 217, respectively. The pre-stage circuits 231 to 233 receive selection signals 241P and 241N, selection signals 242P and 242N, and selection signals 243P and 243N, respectively, in place of the selection signals 240P and 240N according to the first exemplary embodiment. Each of the pre-stage circuits 231 to 233 has substantially the same configuration as that of the pre-stage circuit 230 according to the first exemplary embodiment.

In FIG. 16, PLOE represents the low-voltage pull-up enable signal PULOE and the low-voltage pull-down enable signal PDLOE. In addition, POE represents the pull-up enable signal PUOE and the pull-down enable signal PDOE (the same applies to PLOE2, POE2, PLOE3, and POE3).

The output control circuit 249 selects the number of unit buffers to use on the basis of a driver strength signal DS outputted from a mode resistor included in the control circuit unit (20 in FIG. 2). More specifically, the output control circuit 249 determines whether to activate the pair (241P, 241N), the pair (242P, 242N), or the pair (243P, 243N) on the basis of the driver strength signal DS and sets the logic levels of the determined pair on the basis of the data signal Data.

PTL 3 discloses an operation of driving a data pin DQ in various modes by combining unit buffers used (see FIG. 1 in PTL 3). For example, PTL 3 discloses an operation mode in which the data pin DQ is driven with 40Ω by activating six unit buffers each of which is adjusted to 240Ω. In addition, PTL 3 discloses a 120 Ω ODT (On Die Termination) operation mode and a 240Ω ODT operation mode.

Likewise, the semiconductor device 101 illustrated in FIG. 16 can be configured to perform various operation modes. Each unit buffer can represent 240Ω by causing the calibration circuit 100 to perform a single ZQ calibration operation and by setting the results of the impedance adjustment. If only the pair (243P, 243N) is activated, only the unit buffer 217 is activated. As a result, the input/output terminal DQ can be driven with 240 D. In addition, if only the pair (242P, 242N) is activated, the two unit buffers 215 and 216 are activated. As a result, the input/output terminal DQ can be driven with 120Ω. In addition, if only the pair (241P, 241N) is activated, the four unit buffers 211 to 214 are activated. As a result, the input/output terminal DQ can be driven with 60Ω. In addition, if the pair (241P, 241N) and the pair (242P, 242N) are activated, the six unit buffers 211 to 216 are activated. As a result, the input/output terminal DQ can be driven with 40 Ω.

As described above, according to the second exemplary embodiment, in addition to the advantageous effects obtained by the first exemplary embodiment, the results of a single calibration operation by the calibration circuit 100 can be simultaneously set in a plurality of unit buffers. Thus, for an output buffer that includes a plurality of unit buffers and that is driven with a plurality of impedances depending on a combination of such unit buffers, time necessary for a calibration operation can also be reduced.

Each of the above exemplary embodiments illustrates a case in which five first transistors, a single second transistor (an LV MOS transistor), and a single third transistor (a main transistor) form a plurality of transistors connected in parallel to each other in each output buffer and in each replica buffer. However, the present invention is not limited to such example. The number of first transistors, the number of second transistors, and the number of third transistors may arbitrarily be set.

Modifications and adjustments of the exemplary embodiments are possible within the scope of the overall disclosure (including the claims and the drawings) of the present invention and based on the basic technical concept of the present invention. Various combinations and selections of various disclosed elements (including the elements in each of the claims, exemplary embodiments, drawings, etc.) are possible within the claims of the present invention. That is, the present invention of course includes various variations and modifications that could be made by those skilled in the art according to the overall disclosure including the claims and the drawings and the technical concept. The description discloses numerical value ranges. However, even if the description does not particularly disclose arbitrary numerical values or small ranges included in the ranges, these values and ranges should be deemed to have been specifically disclosed.

What is claimed is:

1. A semiconductor device, comprising:
    an impedance adjustment circuit that generates a plurality of first impedance adjustment signals, a second impedance adjustment signal, and a third impedance adjustment signal and comprises a counter circuit outputting a count value thereof as the plurality of first impedance adjustment signals, a mode selection circuit setting the second impedance adjustment signal to be in an active state or in an inactive state irrespective of the count value of the counter circuit, and a level fixing circuit fixing the third impedance adjustment signal to be in an active state;
    a pre-stage circuit that generates a plurality of first output control signals in response to a data signal and the plurality of first impedance adjustment signals, generates a second output control signal in response to the data signal and the second impedance adjustment signal, and generates a third output control signal in response to the data signal and the third impedance adjustment signal;
    a first power supply wiring;
    an output terminal; and
    an output circuit that comprises a plurality of first transistors, a second transistor, and a third transistor connected in parallel to each other between the output terminal and the first power supply wiring, the plurality of first transistors being configured to receive the plurality of first output control signals via control terminals of the first transistors, respectively, the second transistor being configured to receive the second output control signal via a control terminal of the second transistor, and the third transistor being configured to receive the third output control signal via a control terminal of the third transistor.

2. The semiconductor device according to claim 1;
    wherein on-resistance of the second transistor is smaller than on-resistances of the plurality of first transistors.

3. The semiconductor device according to claim 1, further comprising:
    a replica circuit that comprises a plurality of fourth transistors, a fifth transistor, and a sixth transistor corresponding to the plurality of first transistors, the second transistor, and the third transistor in the output circuit, respectively, and being connected in parallel to each other;
    wherein the counter circuit, the mode selection circuit, and the level fixing circuit control the plurality of fourth transistors, the fifth transistor, and the sixth transistor on the basis of the plurality of first impedance adjustment signals, the second impedance adjustment signal, and the third impedance adjustment signal, respectively, to adjust a replica impedance of the replica circuit.

4. The semiconductor device according to claim 3;
    wherein on-resistance of the fifth transistor is smaller than on-resistances of the plurality of fourth transistors.

5. The semiconductor device according to claim 3;
    wherein, in a predetermined determination period, the impedance adjustment circuit compares the replica impedance with a desired value while controlling the plurality of first impedance adjustment signals and the third impedance adjustment signal to be in an active state and the second impedance adjustment signal to be in an inactive state; and
    wherein, after the predetermined determination period, the mode selection circuit in the impedance adjustment circuit sets the second impedance adjustment signal on the basis of a result of the comparison.

6. The semiconductor device according to claim 5;
    wherein, if the result of the comparison indicates that the replica impedance is larger than the desired value, the mode selection circuit in the impedance adjustment circuit sets the second impedance adjustment signal to be in an active state after the predetermined determination period and if the result of the comparison indicates that the replica impedance is smaller than the desired value, the mode selection circuit in the impedance adjustment circuit sets the second impedance adjustment signal to be in an inactive state after the predetermined determination period.

7. The semiconductor device according to claim 5;
    wherein the mode selection circuit generates a determination mode end signal indicating that the predetermined determination period is ended; and
    wherein the impedance adjustment circuit starts adjustment of the replica impedance by using the plurality of first impedance adjustment signals outputted by the counter circuit in response to the determination mode end signal.

8. The semiconductor device according to claim 5, comprising:
    an external resistor that has an impedance corresponding to the desired value;
    a first terminal that is connected to one end of the replica circuit and one end of the external resistor; and
    a comparison circuit that comprises two input nodes, one of which being connected to the first terminal and the other of which being supplied with a reference voltage;
    wherein the comparison circuit outputs the result of the comparison.

9. The semiconductor device according to claim 5, comprising:
    a second replica circuit that has an impedance adjusted to correspond to the desired value;
    a first node that is connected to one end of the replica circuit and one end of the second replica circuit; and
    a comparison circuit that comprises two input nodes, one of which being connected to the first node and the other of which being supplied with a reference voltage;
    wherein the comparison circuit outputs the result of the comparison.

10. An output circuit impedance adjustment method for adjusting an impedance of an output circuit comprising a plurality of transistors connected in parallel to each other, the method comprising:
    comparing a replica impedance of a replica circuit having a same configuration as that of the plurality of transistors connected in parallel to each other in the output circuit with a desired value while controlling one of the plurality of transistors in the replica circuit to be off as an initial adjustment transistor and transistors other than the initial adjustment transistor to be on in a predetermined determination period;

setting, if a result of the comparison indicates that the replica impedance is larger than the desired value, the initial adjustment transistor to on and adjusting the replica impedance by using the transistors other than the initial adjustment transistor after the predetermined determination period;

setting, if a result of the comparison indicates that the replica impedance is smaller than the desired value, the initial adjustment transistor to off and adjusting the replica impedance by using the transistors other than the initial adjustment transistor after the predetermined determination period; and setting on/off of the plurality of transistors in the output circuit on the basis of a result of the adjustment of the replica impedance.

* * * * *